United States Patent
Kang et al.

(10) Patent No.: US 12,243,961 B2
(45) Date of Patent: Mar. 4, 2025

(54) LIGHT-EMITTING ELEMENT, LIGHT-EMITTING ELEMENT UNIT INCLUDING THE LIGHT-EMITTING ELEMENT, AND DISPLAY DEVICE

(71) Applicant: Samsung Display Co., LTD., Yongin-si (KR)

(72) Inventors: Hye Lim Kang, Hwaseong-si (KR); Moon Jung An, Hwaseong-si (KR); Je Won Yoo, Bucheon-si (KR); Dong Eon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 592 days.

(21) Appl. No.: 17/476,927

(22) Filed: Sep. 16, 2021

(65) Prior Publication Data

US 2022/0238756 A1    Jul. 28, 2022

(30) Foreign Application Priority Data

Jan. 27, 2021    (KR) .................... 10-2021-0011244

(51) Int. Cl.
*H01L 33/10* (2010.01)
*H01L 27/15* (2006.01)
*H01L 33/38* (2010.01)

(52) U.S. Cl.
CPC ............ *H01L 33/10* (2013.01); *H01L 27/156* (2013.01); *H01L 33/38* (2013.01)

(58) Field of Classification Search
CPC ....... H01L 33/10; H01L 27/156; H01L 33/38; H01L 25/167; H01L 33/405;
(Continued)

(56) References Cited

U.S. PATENT DOCUMENTS 8,686,447 B2 * 4/2014 Tomoda ................ H01L 33/46
257/97
2014/0124802 A1    5/2014 Do et al.
(Continued)

FOREIGN PATENT DOCUMENTS

JP    2018-527748    9/2018
KR    10-0973259    8/2010
(Continued)

OTHER PUBLICATIONS

International Search Report corresponding to International Application No. PCT/KR2022/001283 dated May 9, 2022.
(Continued)

*Primary Examiner* — Jarrett J Stark
(74) *Attorney, Agent, or Firm* — KILE PARK REED & HOUTTEMAN PLLC

(57) ABSTRACT

A light-emitting element includes a light-emitting element core extending in a direction and including a first semiconductor layer, a second semiconductor layer disposed on the first semiconductor layer, and a device active layer disposed between the first semiconductor layer and the second semiconductor layer, a device insulating film surrounding a lateral surface of the light-emitting element core, and a reflective film disposed on an outer lateral surface of the device insulating film and surrounding at least a lateral surface of the device active layer.

20 Claims, 34 Drawing Sheets

(58) Field of Classification Search
CPC . H01L 25/0753; H01L 33/0093; H01L 33/08; H01L 33/42; H01L 33/62; H01L 2933/0025; H01L 33/44; H01L 33/46; H01L 33/20; H01L 27/1214; H01L 33/24
See application file for complete search history.

(56) References Cited

U.S. PATENT DOCUMENTS

| | | | |
|---|---|---|---|
| 2018/0374988 A1* | 12/2018 | Mi | H01L 33/0025 |
| 2019/0123033 A1* | 4/2019 | Martin | H01L 24/16 |
| 2020/0066786 A1* | 2/2020 | Hartensveld | H01L 33/06 |
| 2021/0167050 A1* | 6/2021 | Cho | H01L 27/124 |
| 2022/0069005 A1* | 3/2022 | Do | H01L 27/156 |
| 2022/0102344 A1* | 3/2022 | Then | H01L 27/0688 |
| 2022/0165788 A1* | 5/2022 | Lee | H01L 33/0093 |
| 2022/0209063 A1* | 6/2022 | Do | H01L 33/40 |
| 2022/0262978 A1* | 8/2022 | Munshi | H01L 21/02378 |
| 2022/0367561 A1* | 11/2022 | Liu | H01L 33/32 |
| 2023/0114186 A1* | 4/2023 | Do | H01L 33/387 607/94 |
| 2023/0122059 A1* | 4/2023 | Youn | C09D 5/448 106/31.92 |
| 2023/0227994 A1* | 7/2023 | Youn | C25D 13/08 205/109 |
| 2023/0407122 A1* | 12/2023 | Youn | C09D 11/322 |
| 2023/0407124 A1* | 12/2023 | Kim | C09D 11/52 |
| 2024/0052190 A1* | 2/2024 | Youn | G02F 1/0018 |
| 2024/0059919 A1* | 2/2024 | Kim | C09D 11/36 |
| 2024/0093042 A1* | 3/2024 | Kim | C09D 11/033 |

FOREIGN PATENT DOCUMENTS

| | | |
|---|---|---|
| KR | 10-2012-0122645 | 11/2012 |
| KR | 10-1209446 | 12/2012 |
| KR | 10-1258582 | 5/2013 |
| KR | 10-1891777 | 8/2018 |
| KR | 10-2020-0021014 | 2/2020 |
| KR | 10-2020-0079122 | 7/2020 |
| KR | 10-2020-0088948 | 7/2020 |
| KR | 10-2020-0098766 | 8/2020 |
| KR | 10-2021-0079433 | 6/2021 |
| WO | 2021/125757 | 6/2021 |

OTHER PUBLICATIONS

Written Opinion corresponding to International Application No. PCT/KR2022/001283, dated May 9, 2022.

* cited by examiner

30: 31, 32, 33, 37

L3: L3a, L3b
38: 38A, 38B

FIG. 15
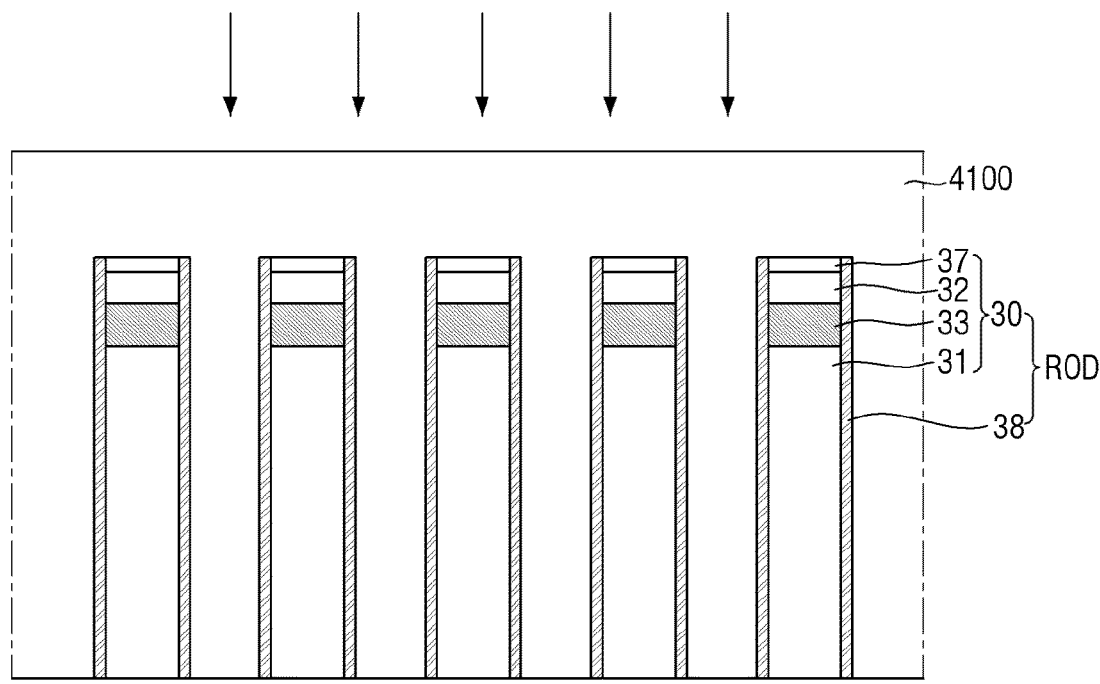
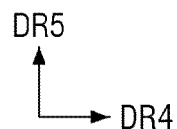

FIG. 17
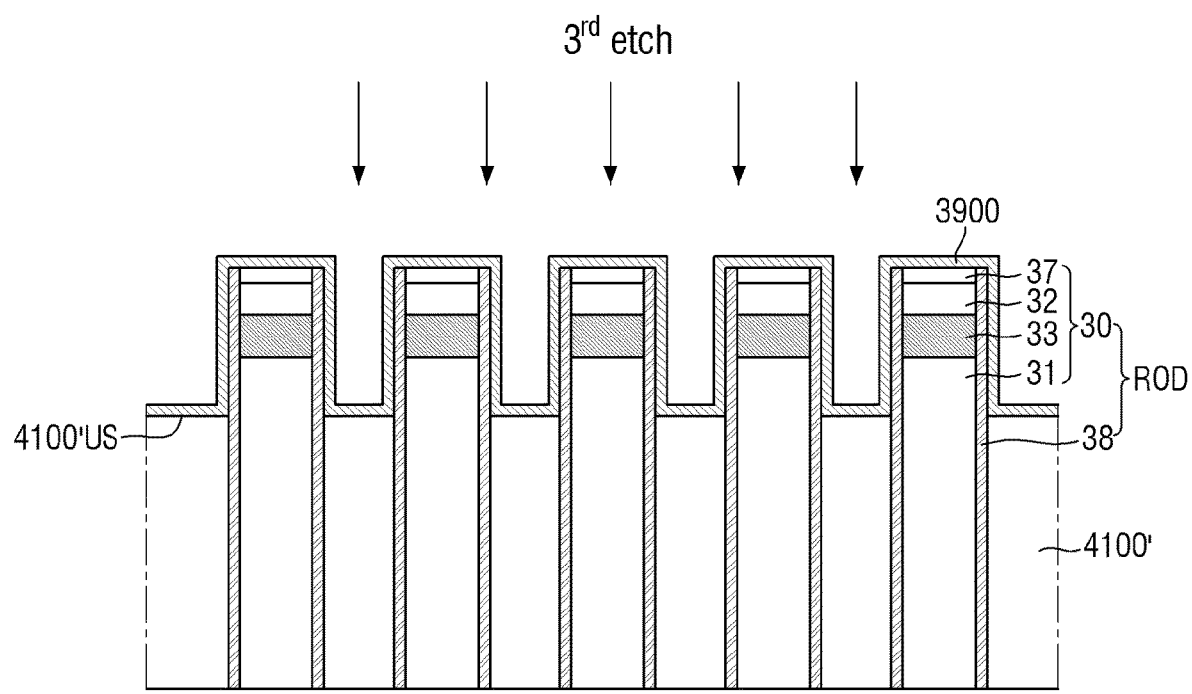
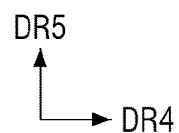

30: 31, 32, 33, 37

30: 31, 32, 33, 37

30: 31, 32, 33, 37

ED: 30, 38, 39
38: 38A, 38B

LU: ED, 40
30: 31, 32, 33, 37
ED: 30, 38, 39

LIGHT-EMITTING ELEMENT, LIGHT-EMITTING ELEMENT UNIT INCLUDING THE LIGHT-EMITTING ELEMENT, AND DISPLAY DEVICE

CROSS-REFERENCE TO RELATED APPLICATION(S)

This application claims priority to and the benefit of Korean Patent Application No. 10-2021-0011244 under 35 U.S.C. § 119, filed in the Korean Intellectual Property Office (KIPO) on Jan. 27, 2021, the entire contents of which are incorporated herein by reference.

BACKGROUND

1. Technical Field

The disclosure relates to a light-emitting element, a light-emitting element unit including the light-emitting element, and a display device.

2. Description of Related Art

Display devices are becoming more important with developments in multimedia technology. Accordingly, various display devices such as an organic light-emitting diode (OLED) display device, a liquid crystal display (LCD) device, and the like have been used.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a light-emitting material and inorganic LEDs (ILEDs) using an inorganic material as a light-emitting material.

SUMMARY

Embodiments of the disclosure provide a light-emitting element having an improved amount of light emitted from both end surfaces thereof.

Embodiments of the disclosure also provide a light-emitting element unit including a plurality of light-emitting elements having an improved amount of light emitted from both end surfaces thereof.

Embodiments of the disclosure also provide a display device having an improved emission efficiency.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a light-emitting element may include a light-emitting element core extending in a direction, the light-emitting element core including a first semiconductor layer, a second semiconductor layer, which is disposed on the first semiconductor layer, and a device active layer, which is disposed between the first and second semiconductor layers; a device insulating film surrounding a lateral surface of the light-emitting element core; and a reflective film disposed on an outer lateral surface of the device insulating film and surrounding at least a lateral surface of the device active layer.

The reflective film may completely overlap the lateral surface of the device active layer.

The reflective film may expose part of the outer lateral surface of the device insulating film.

The first semiconductor layer, the device active layer, and the second semiconductor layer may be sequentially disposed in the direction, and a length of the reflective film in the direction may be shorter than a length of the light-emitting element core in the direction.

The length of the reflective film in the direction may be greater than a thickness of the device active layer.

The reflective film may extend in the direction on the lateral surface of the device active layer and may be disposed even on a lateral surface of the first semiconductor layer or a lateral surface of the second semiconductor layer.

A thickness of the first semiconductor layer in the direction may be greater than a thickness of the second semiconductor layer in the direction, the lateral surface of the first semiconductor layer may include a first area surrounded by the reflective film; and a second area exposed by the reflective film A length of the first area in the direction may be shorter than a length of the second area in the direction.

The device active layer may include a first surface facing a first end surface of the light-emitting element core; and a second surface facing a second end surface of the light-emitting element core. The first end surface of the light-emitting element core may be a surface on a side of the light-emitting element core in the direction, the second end surface of the light-emitting element core may be a surface on another side of the light-emitting element core in the direction, and a distance between the first end surface of the light-emitting element core and the first surface of the device active layer may be smaller than a distance between the second end surface of the light-emitting element core and the second surface of the device active layer.

According to another embodiment of the disclosure, a light-emitting element unit may include a plurality of light-emitting elements extending in a first direction, the plurality of light-emitting elements being aligned with and spaced apart from one another in a second direction that is perpendicular to the first direction; and a binder surrounding the plurality of light-emitting elements and affixing the plurality of light-emitting elements. Each of the plurality of light-emitting elements may include a light-emitting element core, which includes a first semiconductor layer, a second semiconductor layer disposed on the first semiconductor layer, and a device active layer disposed between the first and second semiconductor layers, a device insulating film surrounding a lateral surface of the light-emitting element core, and a reflective film disposed on an outer lateral surface of the device insulating film and surrounding at least a lateral surface of the device active layer.

The reflective film may completely overlap the lateral surface of the device active layer.

The first semiconductor layer, the device active layer, and the second semiconductor layer may be sequentially disposed in the first direction, and a length of the reflective film in the first direction may be shorter than a length of the light-emitting element core in the first direction.

The length of the reflective film in the first direction may be greater than a thickness of the device active layer in the first direction.

A thickness of the binder in the first direction may be smaller than the length of the light-emitting element core in the first direction.

The device insulating film may include a first area surrounded by the reflective film; and a second area exposed by the reflective film. The binder may be disposed on the second area of the device insulating film and is not disposed on the first area of the device insulating film.

The binder may surround the first semiconductor layer and may not surround the second semiconductor layer or the device active layer.

The reflective film may contact a surface of the binder facing the device active layer.

The binder may expose end portions of the light-emitting element core, and the reflective film may be disposed on an end portion of the light-emitting element core but may not be disposed on another end portion of the light-emitting element core.

According to another embodiment of the disclosure, a display device may include a first electrode and a second electrode disposed on a substrate and spaced apart from one another in a first direction; and a plurality of light-emitting elements disposed between the first and second electrodes, the plurality of light-emitting elements extending in the first direction. Each of the plurality of light-emitting elements may include a light-emitting element core, which extends in the first direction and includes a first semiconductor layer, a second semiconductor layer disposed on the first semiconductor layer, and a device active layer disposed between the first and second semiconductor layers, a device insulating film surrounding a lateral surface of the light-emitting element core, and a reflective film disposed on an outer lateral surface of the device insulating film and surrounding at least a lateral surface of the device active layer.

The reflective film may completely overlap the lateral surface of the device active layer.

The first semiconductor layer, the device active layer, and the second semiconductor layer may be sequentially disposed in the first direction, and a length of the reflective film in the first direction may be shorter than a length of the light-emitting element core in the first direction.

The first electrode may be electrically connected to a first end portion of each of the plurality of light-emitting elements, and the second electrode may be electrically connected to a second end portion of each of the plurality of light-emitting elements.

The first direction may be parallel to a surface of the substrate.

The display device may further comprise an insulating layer disposed on the plurality of light-emitting elements and exposing end portions of each of the plurality of light-emitting elements.

The first direction may be parallel to a thickness direction of the substrate.

The display device may further comprise a binder surrounding the plurality of light-emitting elements, the binder affixing the plurality of light-emitting elements.

The binder may not overlap the reflective film in a second direction perpendicular to the first direction.

The plurality of light-emitting elements may be disposed on the first electrode, and the second electrode may be disposed on the plurality of light-emitting elements.

According to the aforementioned and other embodiments of the disclosure, as each light-emitting element includes a light-emitting element core having a device active layer and a reflective film surrounding the lateral surface of the light-emitting element core, light generated by the device active layer and emitted through the outer surfaces of the light-emitting element core can be induced toward both end portions of the light-emitting element core. Thus, the amount of light emitted from each light-emitting element on a substrate to travel in a downward direction can be reduced, and as a result, the emission efficiency of each light-emitting element can be improved.

Also, as a light-emitting element unit includes a plurality of light-emitting elements and a binder surrounding and fixing the outer surfaces of each of the light-emitting elements, the light-emitting elements can be arranged so that first end portions of the light-emitting elements where reflective films are formed can face the display direction of a display device. As a result, the amount of light emitted through the top surfaces of the light-emitting element cores of the light-emitting elements can be increased, and the display efficiency of the display device can be improved. Also, as the light-emitting elements can be fixed by the binder, the alignment of the light-emitting elements between first and second electrodes can be facilitated without a requirement of an additional process of applying an electric field.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which:

FIGS. 8 through 19 are schematic cross-sectional views illustrating a method of fabricating a light-emitting element according to an embodiment of the disclosure;

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be MORE thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
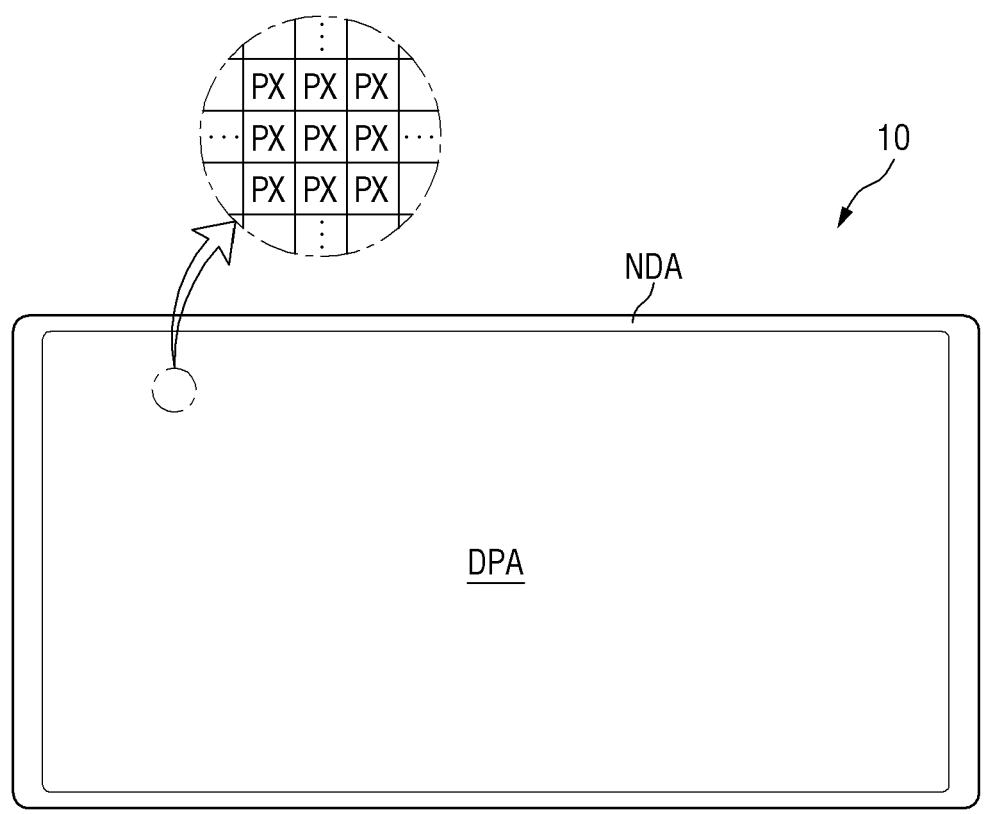
FIG. 1 is a schematic plan view of a display device according to an embodiment of the present disclosure.

FIG. 1 is a schematic plan view of a display device according to an embodiment.

Referring to FIG. 1, a display device 10 displays a moving or still image. The display device 10 may refer to all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel may include an inorganic light-emitting diode (ILED) display panel, an organic LED (OLED) display panel, a quantum-dot light-emitting diode (QLED) display panel, a plasma display panel (PDP), and a field emission display (FED) panel. The display panel of the display device 10 will hereinafter be described as being an ILED display panel, but the present disclosure is not limited thereto.

First, second, and third directions DR1, DR2, and DR3 are defined as illustrated in the accompanying drawings. Specifically, the first and second directions DR1 and DR2 may be directions that are perpendicular to each other within the same plane. The third direction DR3 may be a direction that is perpendicular to the plane that is defined by the first and second directions DR1 and DR2. The third direction DR3 may be perpendicular to each of the first and second directions DR1 and DR2. The third direction DR3 refers to the thickness direction (or the display direction) of the display device 10.

The display device 10 may have a rectangular shape that has long sides longer in the first direction DR1 than in the second direction DR2 and short sides, in a plan view. The corners at which the long sides and the short sides of the display device 10 meet may be right-angled, but the disclosure is not limited thereto. As another example, the corners at which the long sides and the short sides of the display device 10 meet may be rounded. The planar shape of the display device 10 is not particularly limited but may vary. The display device 10 may have various shapes other than a rectangular shape, such as a square shape, a rectangular shape with rounded corners, a non-tetragonal polygonal shape, or a circular shape.

The display surface of the display device 10 may be disposed on a side of the display device 10 in the third direction DR3 (or thickness direction). Unless specified otherwise, the terms "above" and "top" as used herein refer to the third direction DR3 (or the display direction of the display device 10), and the term "top surface" as used herein refers to a surface that is directed to the side in the third direction DR3. Unless specified otherwise, the terms "below" and "bottom," as used herein, refer to the opposite direction of the third direction DR3 (or the opposite direction of the display direction of the display device 10), and the term "bottom surface," as used herein, refers to a surface that is directed to the opposite direction of the third direction DR3. Unless specified otherwise, the terms "left," "right," "upper," and "lower," as used herein, refer to their respective directions as viewed from above the display device 10. For example, the term "right" refers to the first direction DR1, the term "left" refers to the opposite direction of the first direction DR1, the term "upper" refers to the second direction DR2, and the term "lower" refers to the opposite direction of the second direction DR2.

The display device 10 may include a display area DPA and a non-display area NDA. The display area DPA is an area in which an image is displayed, and the non-display area NDA is an area in which no image is displayed.

The shape of the display area DPA may conform to the shape of the display device 10. In an embodiment, the display area DPA may have a similar shape to the display device 10, for example, a rectangular shape, in a plan view. The display area DPA may generally account for the middle part of the display device 10.

The display area DPA may include pixels PX. The pixels PX may be arranged in row and column directions. The pixels PX may have a rectangular or square shape in a plan view. In an embodiment, each of the pixels PX may include light-emitting elements that are formed of inorganic particles.

The non-display area NDA may be disposed around the display area DPA. The non-display area NDA may surround the entire display area DPA or part of the display area DPA. The non-display area NDA may form the bezel of the display device 10.

Figure 2:
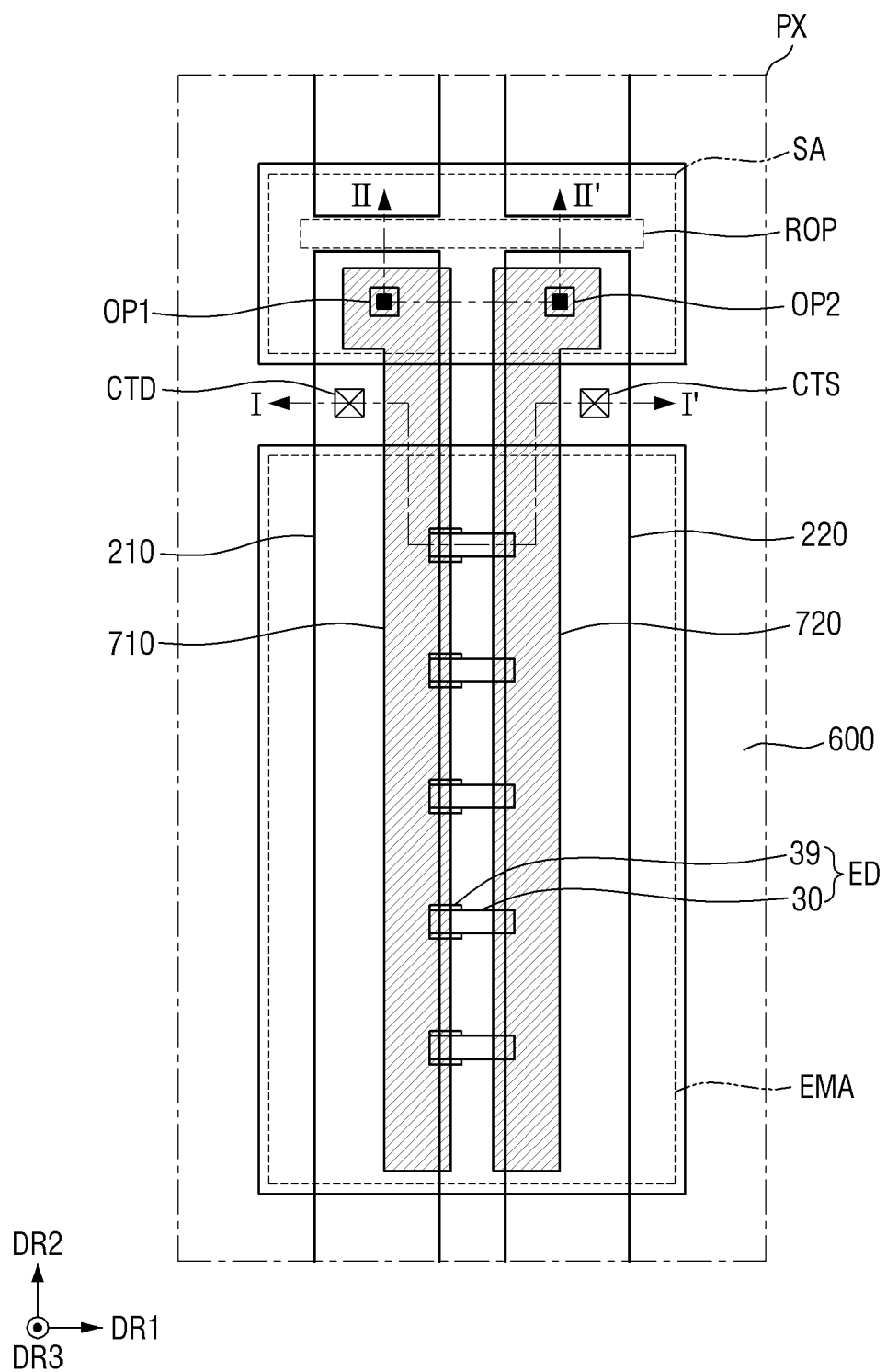
FIG. 2 is a schematic plan view of a pixel of the display device of FIG. 1.

FIG. 2 is a schematic plan view of a pixel of the display device of FIG. 1.

Referring to FIG. 2, a pixel PX of the display device 10 may include an emission area EMA and a non-emission area. The emission area EMA may be defined as a region that outputs light emitted by light-emitting elements ED, and the non-emission area may be defined as a region that is not reached by light emitted by the light-emitting elements ED and thus does not output light.

The emission area EMA may include a region where the light-emitting elements ED are disposed and a region around the region where the light-emitting elements ED are disposed. Also, the emission area EMA may further include a region that outputs light emitted by the light-emitting elements ED and then reflected or refracted by other elements.

The pixel PX may include a subarea SA, which is disposed in the non-emission area. The light-emitting elements ED may not be disposed in the subarea SA. The subarea SA may be disposed above the emission area EMA (or on a first side of the emission area EMA in the second direction DR2), in the pixel PX. The subarea SA may be disposed between the emission area EMA and another emission area EMA of a neighboring pixel PX adjacent to the pixel PX in the second direction DR2.

The subarea SA may include a separation part ROP. The separation part ROP of the subarea SA may be a region where the first and second electrodes 210 and 220 are separated from first and second electrodes 210 and 220 of the neighboring pixel PX. Therefore, parts of the first and second electrodes 210 and 220 of the pixel PX and parts of the first and second electrodes 210 and 220 of the neighboring pixel PX may be disposed in the subarea SA.

The pixel PX may include electrodes 210 and 220, a first bank 600, contact electrodes 710 and 720, and light-emitting elements ED. The layout of the electrodes 210 and 220, the contact electrodes 710 and 720, the light-emitting elements ED, and the first bank 600 in the pixel PX will hereinafter be described.

The first bank 600 may include parts that extend in the first direction DR1 and parts that extend in the second direction DR2, in a plan view, and may be disposed in a lattice pattern over the entire surface of the display area DPA. The first bank 600 may be disposed along the boundaries of the pixel PX to separate the pixel PX from other pixels PX. The first bank 600 may be disposed in the pixel PX to surround the emission area EMA and the subarea SA of the pixel PX. For example, the emission area EMA and the subarea SA of the pixel PX may be defined by the first bank 600.

The electrodes 210 and 220 may include first and second electrodes 210 and 220, which are spaced apart from each other.

The first electrode 210 may be disposed on the left side of the pixel PX in a plan view. The first electrode 210 may extend in the second direction DR2 in a plan view. The first electrode 210 may be disposed in and across the emission area EMA and the subarea SA. The first electrode 210 may extend in the second direction DR2 in a plan view and may be isolated from a first electrode 210 of the neighboring pixel PX, in the separation part ROP.

The second electrode 220 may be disposed to be spaced apart from the first electrode 210 in the first direction DR1. The second electrode 220 may be disposed on the right side of the pixel PX in a plan view. The second electrode 220 may extend in the second direction DR2 in a plan view. The second electrode 220 may be disposed in and across the emission area EMA and the subarea SA. The second electrode 220 may extend in the second direction DR2 in a plan view and may be isolated from a second electrode 220 of the neighboring pixel PX, in the separation part ROP.

The light-emitting elements ED may be disposed between the first and second electrodes 210 and 220. The light-emitting elements ED may extend in a direction, and both end portions of each of the light-emitting elements ED in the direction in which the light-emitting elements ED extend may be placed on the first and second electrodes 210 and 220. In an embodiment, first end portions of the light-emitting elements ED may be placed on the first electrode 210, and second end portions of the light-emitting elements ED may be placed on the second electrode 220.

The direction in which the light-emitting elements ED extend may be substantially perpendicular to the direction in which the first and second electrodes 210 and 220 extend, but the disclosure is not limited thereto. As another example, some (or a part) of the light-emitting elements ED may be disposed substantially perpendicularly to the direction in which the first and second electrodes 210 and 220 extend, and some of the light-emitting elements ED may be disposed diagonally with respect to the direction in which the first and second electrodes 210 and 220 extend.

The light-emitting elements ED include light-emitting element cores 30 and reflective films 39, which are disposed to surround parts of the lateral surfaces of the light-emitting element cores 30.

The shape of the light-emitting element cores 30 may be substantially similar to the shape of the light-emitting elements ED. Specifically, the light-emitting element cores 30 may extend in the direction in which the light-emitting elements ED extend. First end portions of the light-emitting element cores 30 may be placed on the first electrode 210, and second end portions of the light-emitting element cores 30 may be placed on the second electrode 220.

The reflective films 39 may be disposed on the lateral surfaces of the light-emitting element cores 30. The reflective films 39 may be disposed to surround the parts of the lateral surfaces of the light-emitting element cores 30. The reflective films 39 may be disposed to surround the lateral surfaces of the first end portions of the light-emitting element cores 30, but may not be disposed on the lateral surfaces of the second end portions of the light-emitting element cores 30.

The contact electrodes 710 and 720 may include first and second contact electrodes 710 and 720, which are spaced apart from each other.

The first contact electrode 710 may be disposed on the first electrode 210. The first contact electrode 710 may extend in the second direction DR2. The first contact electrode 710 may contact (or electrically contact) the first electrode 210 and the first end portions of the light-emitting elements ED. The first contact electrode 710 may contact part of the first electrode 210 exposed by a first opening OP1, in the subarea SA, and contact the first end portions of the light-emitting elements ED, in the emission area EMA. As the first contact electrode 710 contacts the first electrode 210 and the first end portions of the light-emitting elements ED, electrical signals applied to the first electrode 210 may be transmitted to the first end portions of the light-emitting elements ED through the first contact electrode 710.

The second contact electrode 720 may be disposed on the second electrode 220. The second contact electrode 720 may extend in the second direction DR2. The second contact electrode 720 may contact the second electrode 220 and the second end portions of the light-emitting elements ED. The second contact electrode 720 may contact part of the second electrode 220 exposed by a second opening OP2, in the subarea SA, and contact the second end portions of the light-emitting elements ED, in the emission area EMA. As the second contact electrode 720 contacts the second electrode 220 and the second end portions of the light-emitting elements ED, electrical signals applied to the second electrode 220 may be transmitted to the second end portions of the light-emitting elements ED through the second contact electrode 720.

Figure 3:
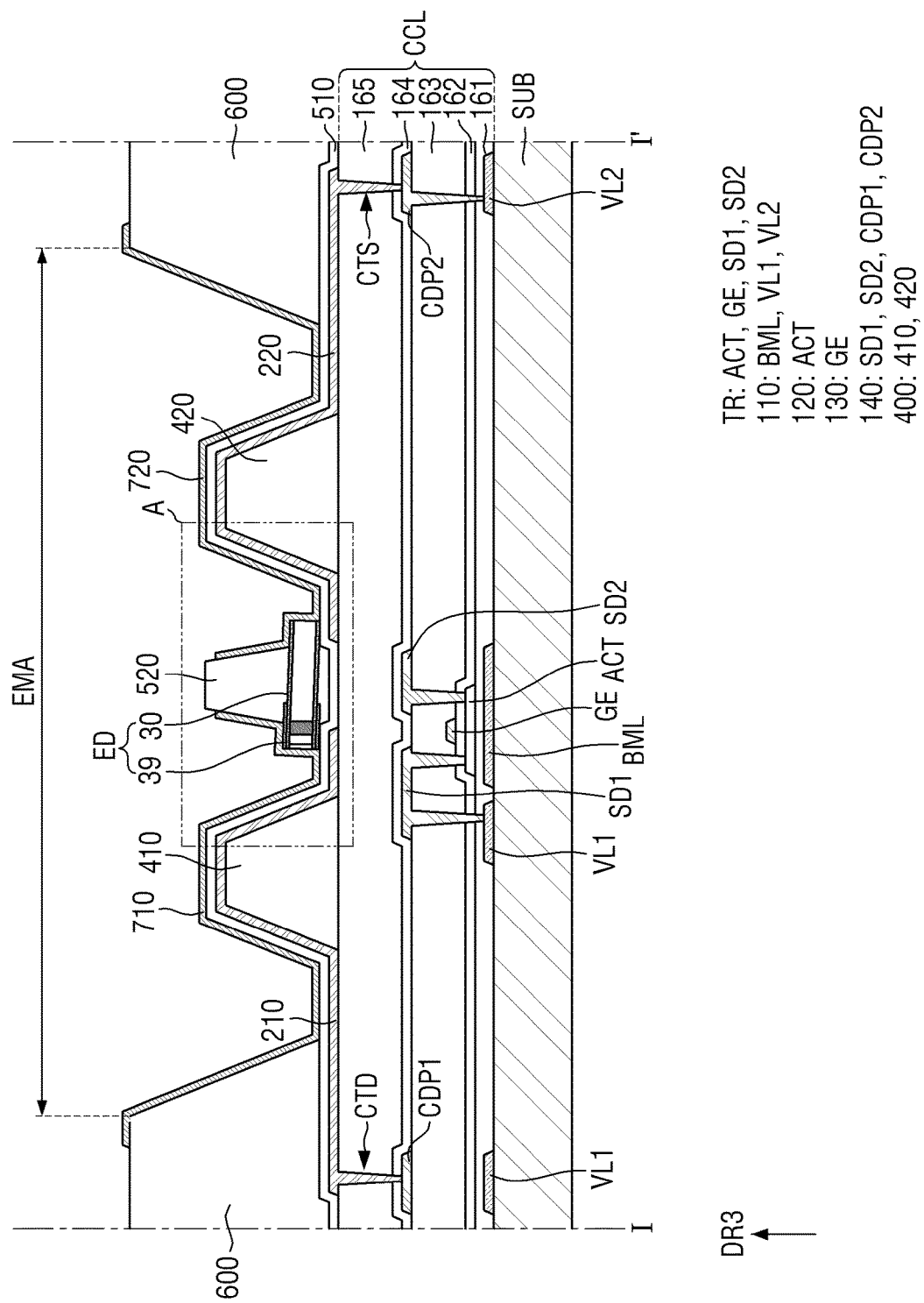
FIG. 3 is a schematic cross-sectional view taken along line I-I' of FIG. 2.
Figure 4:
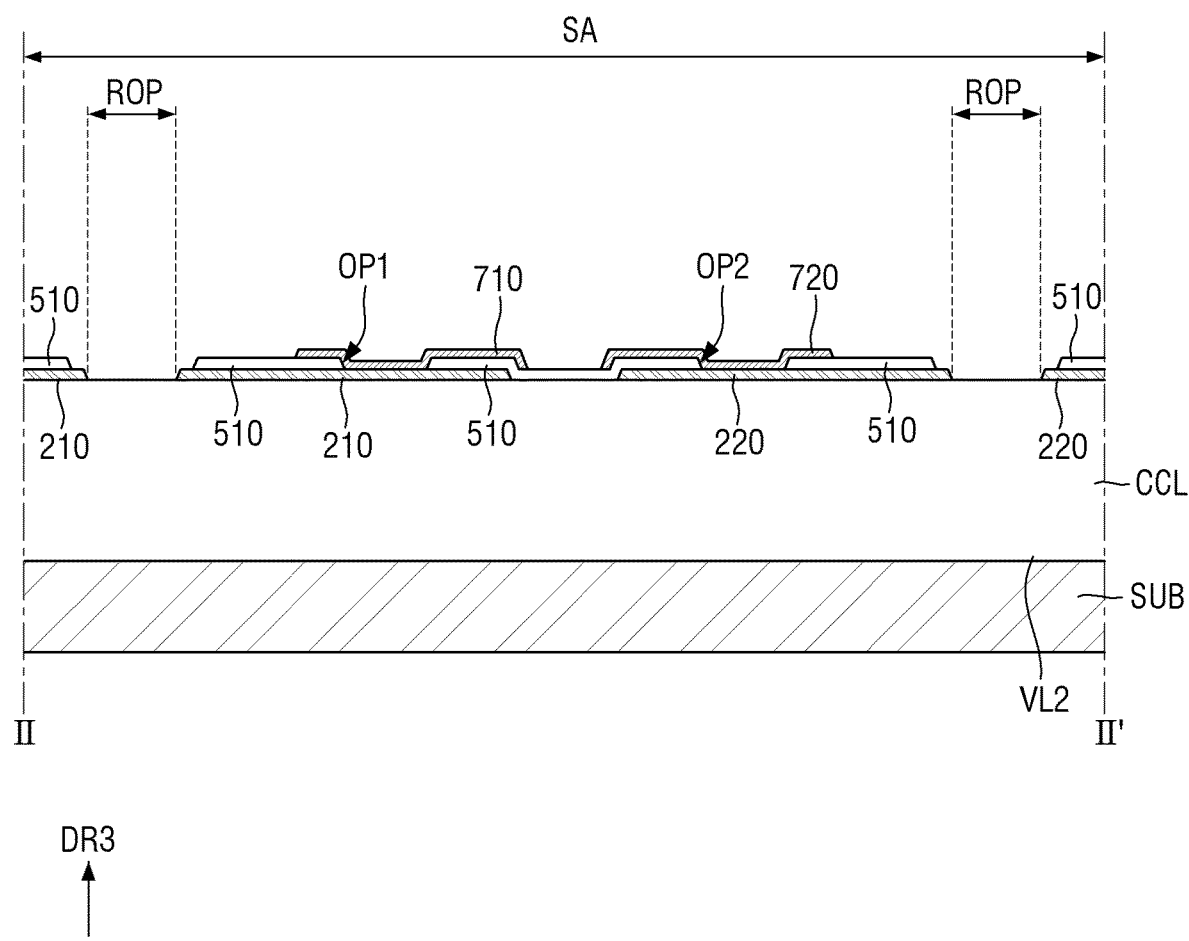
FIG. 4 is a schematic cross-sectional view taken along line II-II' of FIG. 2.

FIG. 3 is a schematic cross-sectional view taken along line I-I' of FIG. 2. FIG. 4 is a schematic cross-sectional view taken along line II-IF of FIG. 2.

Referring to FIG. 3, the display device 10 may include a substrate SUB, a circuit element layer CCL disposed on the substrate SUB, and a display element layer disposed on the circuit element layer CCL, and the display element layer may include first and second electrodes 210 and 220, a second bank 400, first and second contact electrodes 710 and 720, light-emitting elements ED, a first bank 600, and first and second insulating layers 510 and 520.

The substrate SUB may be an insulating substrate. The substrate SUB may be formed of an insulating material such as glass, quartz, or a polymer resin. The substrate SUB may be a rigid substrate or a flexible substrate that is bendable, foldable, or rollable.

The circuit element layer CCL may be disposed on the substrate SUB. The circuit element layer CCL may include a lower metal layer 110, a semiconductor layer 120, a first conductive layer 130, a second conductive layer 140, and insulating films The lower metal layer 110 may be disposed on the substrate SUB. The lower metal layer 110 may include a light-blocking layer BML and first and second voltage lines VL1 and VL2.

The first voltage line VL1 may overlap at least part of a first electrode SD1 of a transistor TR in the thickness direction of the substrate SUB. A high-potential voltage (or a first power supply voltage) to be supplied to the transistor TR may be applied to the first voltage line VL1.

The second voltage line VL2 may overlap a second conductive pattern CDP2 in the thickness direction of the substrate SUB. A low-potential voltage (or a second power supply voltage), which is lower than the high-potential voltage, may be applied to the second voltage line VL2. The second power supply voltage may be applied to the second electrode 220. An alignment signal for aligning light-emitting elements ED may be applied to the second voltage line VL2 during the fabrication of the display device 10.

The light-blocking layer BML may be disposed to cover (or overlap) at least the entire channel region of the active layer ACT of the transistor TR, and even the entire active layer ACT of the transistor TR, from below the transistor TR, but the disclosure is not limited thereto. The light-blocking member BML may not be provided.

The lower metal layer 110 may include a material capable of blocking light. In an embodiment, the lower metal layer 110 may be formed of an opaque metal material capable of blocking the transmission of light.

A buffer layer 161 may be disposed on the lower metal layer 110. The buffer layer 161 may be disposed to cover (or overlap)the entire surface of the substrate SUB where the lower metal layer 110 is disposed. The buffer layer 161 may protect the transistor TR from moisture that may penetrate the substrate SUB, which is vulnerable to moisture.

A semiconductor layer 120 may be disposed on the buffer layer 161. The semiconductor layer 120 may include the active layer ACT of the transistor TR. As described above, the active layer ACT of the transistor TR may be disposed to overlap the light-blocking layer BML of the lower metal layer 110.

The semiconductor layer 120 may include polycrystalline silicon, monocrystalline silicon, or an oxide semiconductor. Here, polycrystalline silicon may be formed by crystallizing amorphous silicon. In case that the semiconductor layer 120 includes polycrystalline silicon, the active layer ACT of the transistor TR may include doped regions that are doped with impurities and a channel region between the doped regions. In an embodiment, the semiconductor layer 120 may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulating film 162 may be disposed on the semiconductor layer 120. The gate insulating film 162 may function as a gate insulating film for the transistor TR. The gate insulating film 162 may be formed as a multi-layer in which inorganic layers including at least one of, for example, silicon oxide ($SiO_x$), silicon nitride ($SiN_x$), and silicon oxynitride ($SiO_xN_y$) are alternately stacked.

The first conductive layer 130 may be disposed on the gate insulating film 162. The first conductive layer 130 may include a gate electrode GE of the transistor TR. The gate electrode GE of the transistor TR may be disposed to overlap the channel region of the active layer ACT of the transistor TR in the third direction DR3, which is the thickness direction of the substrate SUB.

An interlayer insulating film 163 may be disposed on the first conductive layer 130. The interlayer insulating film 163 may be disposed to cover (or overlap) the gate electrode GE. The interlayer insulating film 163 may serve as an insulating film between the first conductive layer 130 and other layers disposed on the first conductive layer 130 and may protect the first conductive layer 130.

A second conductive layer 140 may be disposed on the interlayer insulating film 163. The second conductive layer 140 may include first and second electrodes SD1 and SD2 of the transistor TR, a first conductive pattern CDP1, and a second conductive pattern CDP2.

The first electrode SD1 and the second electrode SD2 of the transistor TR may be electrically connected to both end portions of the active layer ACT of the transistor TR through contact holes that penetrate the interlayer insulating film 163 and the gate insulating film 162. The first electrode SD1 may be electrically connected to the first voltage line VL1 of the lower metal layer 110 through a contact hole that penetrates the interlayer insulating film 163, the gate insulating film 162, and the buffer layer 161.

The first conductive pattern CDP1 may be electrically connected to the second electrode SD2 of the transistor TR. The first conductive pattern CDP1 may be electrically connected to the first electrode 210 through a first electrode contact hole CTD, which penetrates a via layer 165. The transistor TR may transmit the first power supply voltage applied from the first voltage line VL1 to the first electrode 210 through the first conductive pattern CDP1.

The second conductive pattern CDP2 may be electrically connected to the second voltage line VL2. The second conductive pattern CDP2 may be electrically connected to the second voltage line VL2 through a contact hole that penetrates the interlayer insulating film 163, the gate insulating film 162, and the buffer layer 161. The second conductive pattern CDP2 may be electrically connected to the second electrode 220 through a second electrode contact hole CTS. The second conductive pattern CDP2 may transmit the second power supply voltage, applied to the second voltage line VL2, to the second electrode 220.

FIG. 3 illustrates that the first and second conductive patterns CDP1 and CDP2 are formed in a same layer, but the disclosure is not limited thereto. As another example, the second conductive pattern CDP2 may be formed in a different conductive layer from the first conductive pattern CDP1, for example, in a third conductive layer disposed on the second conductive layer 140 with a number of insulating layers interposed therebetween. In this case, the first and second voltage lines VL1 and VL2 may be formed in the third conductive layer, rather than in the lower metal layer 110, and the first voltage line VL1 may be electrically connected to the first electrode SD1 of the transistor TR by another conductive pattern.

A passivation layer 164 may be disposed on the second conductive layer 140. The passivation layer 164 may be disposed on the interlayer insulating film 163 where the second conductive layer 140 is disposed. The passivation layer 164 may protect the conductive layers therebelow.

The via layer 165 may be disposed on the passivation layer 164. The via layer 165 may include an organic insulating material such as polyimide (PI). The via layer 165 may perform a surface planarization function.

Each of the buffer layer 161, the gate insulating film 162, the interlayer insulating film 163, and the passivation layer 164 may include inorganic layers that are alternately stacked. For example, each of the buffer layer 161, the gate insulating film 162, the interlayer insulating film 163, and the passivation layer 164 may be formed as a double-layer or a multi-layer in which inorganic layers including at least one of $SiO_x$, $SiN_x$, and $SiO_xN_y$ are alternately stacked, but the disclosure is not limited thereto. As another example, each of the buffer layer 161, the gate insulating film 162, the interlayer insulating film 163, and the passivation layer 164 may be formed as a single inorganic layer including $SiO_x$, $SiN_x$, and $SiO_xN_y$.

The structure of the display element layer will hereinafter be described with reference to FIGS. 2 to 4. The display element layer may be disposed on the via layer 165. The display element layer may include the first and second electrodes 210 and 220, the second bank 400, the first bank 600, the light-emitting elements ED, the first and second contact electrodes 710 and 720, and the first and second insulating layers 510 and 520.

The second bank 400 may be disposed on the via layer 165. The second bank 400 may be disposed directly on the via layer 165. The second bank 400 may be disposed in the emission area EMA.

The second bank 400 may include first and second sub-banks 410 and 420, which are spaced apart from each other. The first and second sub-banks 410 and 420 may be spaced apart from each other in the first direction DR1, in the emission area EMA. The light-emitting elements ED may be disposed between the first and second sub-banks 410 and 420, which are spaced apart from each other.

The second bank 400 may include inclined side surfaces and may change the traveling direction of light that is emitted by the light-emitting elements ED to travel toward the second bank 400 into an upward direction (e.g., the display direction). For example, the second bank 400 may provide space in which the light-emitting elements ED are to be disposed, and may serve as a reflective barrier that changes the traveling direction of light emitted by the light-emitting elements ED into the display direction.

FIG. 3 illustrates that side surfaces of the second bank 400 are linearly inclined, but the disclosure is not limited thereto. As another example, the side surfaces (or outer surfaces) of the second bank 400 may have a curved semicircular or semielliptical shape. In an embodiment, the second bank 400 may include an organic insulating material such as PI, but the disclosure is not limited thereto.

The first and second electrodes 210 and 220 may be disposed on the second bank 400 and parts of the via layer 165 exposed by the second bank 400.

Specifically, the first electrode 210 may be disposed on a first sub-bank 410, in the emission area EMA, and on the via layer 165, in the non-emission area. The first electrode 210 may be disposed to cover (or overlap) the outer surface of the first sub-bank 410. The first electrode 210 may be disposed at least on an inclined side surface of the first sub-bank 410 that faces the second sub-bank 420 in the emission area EMA and may reflect light emitted by the light-emitting element ED.

The first electrode 210 may be electrically connected to the first conductive pattern CDP1 through the first electrode contact hole CTD, which penetrates the via layer 165. The first electrode 210 may contact part of the top surface of the first conductive pattern CDP1 exposed by the first electrode contact hole CTD. The first electrode 210 may be electrically connected to the transistor TR by the first conductive pattern CDP1. FIG. 3 illustrates that the first electrode contact hole CTD is disposed to overlap the first bank 600 in the third direction DR3, but the location of the first electrode contact hole CTD is not particularly limited.

The second electrode 220 may be disposed on a second sub-bank 420, in the emission area EMA, and on the via layer 165, in the non-emission area. The second electrode 220 may be disposed to cover (or overlap) the outer surface of the second sub-bank 420. The second electrode 220 may be disposed at least on an inclined side surface of the second sub-bank 420 that faces the first sub-bank 410 in the emission area EMA and may reflect light emitted by the light-emitting element ED.

The second electrode 220 may be electrically connected to the second conductive pattern CDP2 through the second electrode contact hole CTS, which penetrates the via layer 165. The second electrode 220 may contact part of the top surface of the second conductive pattern CDP2 exposed by the second electrode contact hole CTS. The second electrode 220 may be electrically connected to the second voltage line VL2 by the second conductive pattern CDP2. FIG. 3 illustrates that the second electrode contact hole CTS is disposed to overlap the first bank 600 in the third direction DR3, but the location of the second electrode contact hole CTS is not particularly limited.

The first and second electrodes 210 and 220 of the pixel PX may extend in the second direction DR2 in a plan view and may be isolated from first and second electrodes 210 and 220 of the neighboring pixel PX, in the separation part ROP of the subarea SA. The first and second electrodes 210 and 220 of the pixel PX and the first and second electrodes 210 and 220 of the neighboring pixel PX may be obtained by cutting electrode lines for use in aligning the light-emitting elements ED, in the separation part ROP of the subarea SA. Specifically, the light-emitting elements ED may be aligned using electrode lines that extend in the second direction DR2, and the electrode lines may be cut in the separation part ROP of the subarea SA, thereby obtaining the first and second electrodes 210 and 220 of the pixel PX and the first and second electrodes 210 and 220 of the neighboring pixel PX. The electrode lines may be used to generate an electric field in the pixel PX to align the light-emitting elements ED.

The first and second electrodes 210 and 220 may be electrically connected to the light-emitting elements ED. The first and second electrodes 210 and 220 may be electrically connected to both end portions of each of the light-emitting elements ED by the first and second contact electrodes 710 and 720.

The first and second electrodes 210 and 220 may include a conductive material with high reflectance. For example, the first and second electrodes 210 and 220 may include a metal with high reflectance such as silver (Ag), copper (Cu), aluminum (Al), molybdenum (Mo), or titanium (Ti) or an alloy of Al, nickel (Ni), or lanthanum (La). The first and second electrodes 210 and 220 may reflect light emitted by the light-emitting elements ED toward the side surfaces of the second bank 400, in an upward direction of the pixel PX. However, the disclosure is not limited thereto. The first and second electrodes 210 and 220 may further include a transparent conductive material. For example, the first and second electrodes 210 and 220 may include a material such as ITO, IZO, or ITZO. In some embodiments, the first and second electrodes 210 and 220 may be formed as a multilayer structure in which at least one transparent conductive material and at least one high-reflectance metal layer are stacked or as a single layer including the at least one transparent conductive material and the at least one high-reflectance metal layer. The first and second electrodes 210 and 220 may have a stack of ITO/Ag/ITO/, ITO/Ag/IZO, or ITO/Ag/ITZO/IZO.

The first insulating layer 510 may be disposed on the first and second electrodes 210 and 220. The first insulating layer 510 may be disposed to cover (or overlap) the via layer 165, the second bank 400, and the first and second electrodes 210 and 220, in the emission area EMA. The first insulating layer 510 may be disposed on the first and second electrodes 210 and 220 and the via layer 165, in the subarea SA, but may not be disposed in the separation part ROP of the subarea SA.

The first insulating layer 510 may include contacts, which expose at least parts of the first and second electrodes 210 and 220. The contacts may include first and second openings OP1 and OP2, which penetrate the first insulating layer 510. The contacts may be disposed in the subarea SA.

The first insulating layer 510 may protect the first and second electrodes 210 and 220 and may insulate the first and second electrodes 210 and 220 from each other. Also, the first insulating layer 510 may prevent the light-emitting elements ED, which are disposed on the first insulating layer 510, from being damaged by directly contacting the underlying elements. The first insulating layer 510 may include an inorganic insulating material.

The first bank 600 may be disposed on the first insulating layer 510. The first bank 600 may include parts that extend in the first direction DR1 and parts that extend in the second direction DR2, in a plan view, and may be arranged in a lattice pattern.

The first bank 600 may be disposed along the boundaries of the pixel PX to separate the pixel PX from other pixels PX and to define the emission area EMA and the subarea SA of the pixel PX. Also, as the first bank 600 is formed to have a greater height than the second bank 400 and defines the emission area EMA and the subarea SA of the pixel PX, ink having the light-emitting elements ED dispersed therein can be sprayed into the emission area EMA of the pixel PX without infiltrating into adjacent pixels PX in an inkjet process for aligning the light-emitting elements ED during the manufacturing of the display device 10. The first bank 600 may include an organic insulating material such as PI, but the disclosure is not limited thereto.

The light-emitting elements ED may be disposed on the first insulating layer 510, in the emission area EMA. The light-emitting elements ED may be disposed between the first and second sub-banks 410 and 420. The light-emitting elements ED may be disposed on the first insulating layer 510 so that both end portions of each of the light-emitting elements ED may be placed on the first and second electrodes 210 and 220 between the first and second sub-banks 410 and 420.

The light-emitting elements ED may be disposed to be spaced apart from one another in the direction in which the first and second electrodes 210 and 220 extend, for example, in the second direction DR2, and may be aligned substantially in parallel to each other. The light-emitting elements ED may extend in a direction, and the length of the light-emitting elements ED may be greater than the minimum distance between the first and second electrodes 210 and 220, which are spaced apart from each other in the first direction DR1. At least one end portion of each of the light-emitting elements ED may be placed on one of the first and second electrodes 210 and 220, or both end portions of each of the light-emitting elements ED may be placed on the first and second electrodes 210 and 220.

The second insulating layer 520 may be disposed on the light-emitting elements ED. The second insulating layer 520 may be disposed to surround parts of the outer surfaces of each of the light-emitting elements ED, but not to cover (or overlap) both end portions of each of the light-emitting elements ED. Therefore, the width of the second insulating layer 520 in the first direction DR1 may be smaller than the length of the light-emitting elements ED in the first direction DR1. As parts of the second insulating layer 520 disposed on the light-emitting elements ED extend in the second direction DR2 over the first insulating layer 510 in a plan view, linear or island patterns may be formed in the pixel PX. The second insulating layer 520 may protect and affix the light-emitting elements ED during the manufacture of the display device 10.

The first contact electrode 710 may be disposed on the first electrode 210. The first contact electrode 710 may extend in the second direction DR2. The first contact electrode 710 may contact the first electrode 210 and the first end portions of the light-emitting elements ED. The first contact electrode 710 may contact the first end portions of the light-emitting elements ED exposed by the second insulating layer 520, in the emission area EMA. Also, the first contact electrode 710 may contact part of the first electrode 210 exposed by the first opening OP1, which penetrates the first insulating layer 510, in the subarea SA. As already described above, as the first contact electrode 710 contacts the part of the first electrode 210 exposed by the first opening OP1 and the first end portions of the light-emitting elements ED exposed by the second insulating layer 520, electrical signals applied to the first electrode 210 may be transmitted to the first end portions of the light-emitting elements ED through the first contact electrode 710.

The second contact electrode 720 may be disposed on the second electrode 220. The second contact electrode 720 may extend in the second direction DR2. The second contact electrode 720 may contact the second electrode 220 and the second end portions of the light-emitting elements ED. Specifically, the second contact electrode 720 may contact the second end portions of the light-emitting elements ED exposed by the second insulating layer 520, in the emission area EMA. Also, the second contact electrode 720 may contact part of the second electrode 220 exposed by the second opening OP2, which penetrates the first insulating layer 510, in the subarea SA. As already described above, as the second contact electrode 720 contacts the part of the second electrode 220 exposed by the second opening OP2 and the second end portions of the light-emitting elements ED exposed by the second insulating layer 520, electrical signals applied to the second electrode 220 may be transmitted to the second end portions of the light-emitting elements ED through the second contact electrode 720.

The first and second contact electrodes 710 and 720 may be disposed to be spaced apart from each other with the second insulating layer 520 interposed therebetween, in the emission area EMA. At least one of the first and second contact electrodes 710 and 720 may be disposed at least in part on a side of the second insulating layer 520. The first and second contact electrodes 710 and 720 may be spaced apart, and insulated, from each other by the second insulating layer 520.

FIG. 3 illustrates that the first and second contact electrodes 710 and 720 are disposed in the same layer, but the disclosure is not limited thereto. As another example, the first and second contact electrodes 710 and 720 may be disposed in different layers, and there may exist an insulating layer between the first and second contact electrodes 710 and 720.

The first and second contact electrodes 710 and 720 may include a conductive material. In an embodiment, the first and second contact electrodes 710 and 720 may include ITO, IZO, ITZO, or Al. For example, the first and second contact electrodes 710 and 720 may include a transparent conductive material, and light emitted by the light-emitting elements ED may travel toward the first and second electrodes 210 and 220 through the first and second contact electrodes 710 and 720 and may then be reflected by the outer surfaces of each of the first and second electrodes 210 and 220.

Although not specifically illustrated, an insulating layer may be further disposed on the second insulating layer 520 and the first and second contact electrodes 710 and 720. The insulating layer may protect the elements, disposed on the substrate SUB, from an external environment.

Figure 5:
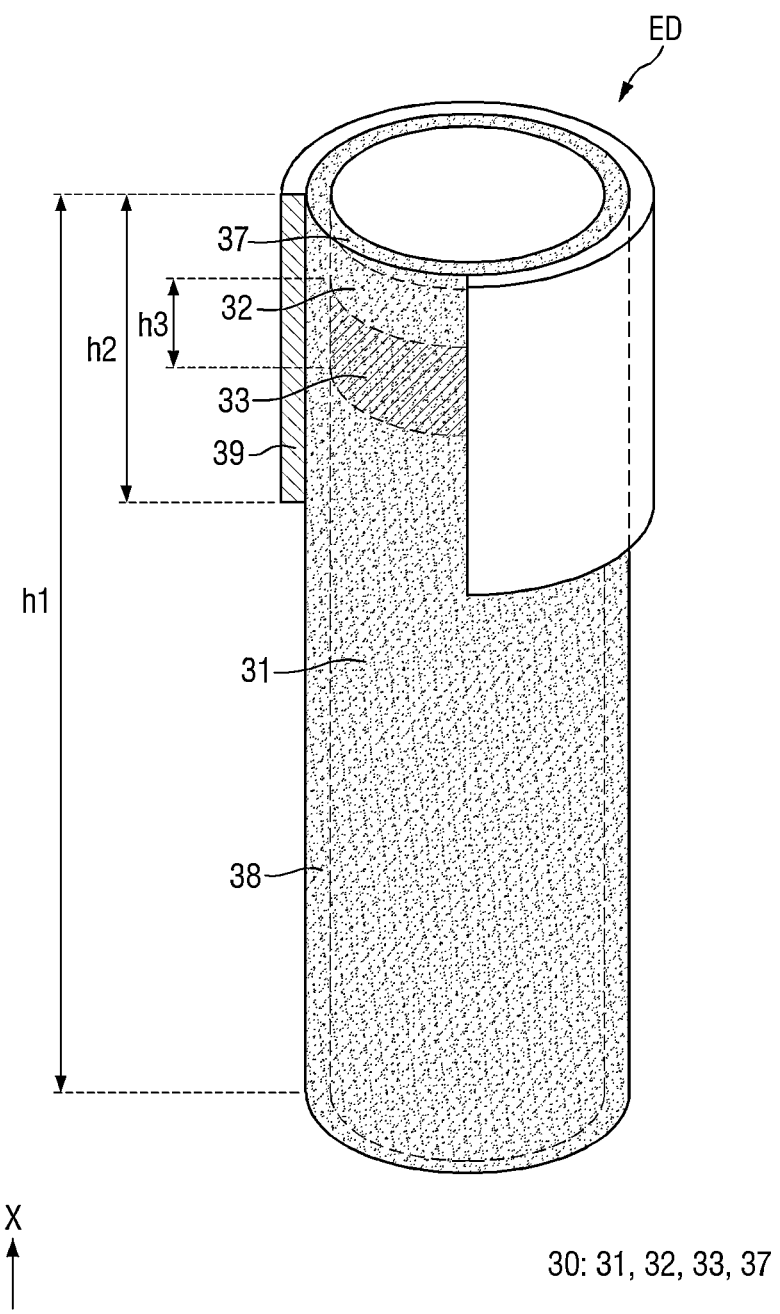
FIG. 5 is a schematic perspective view of a light-emitting element according to an embodiment of the disclosure.
Figure 6:
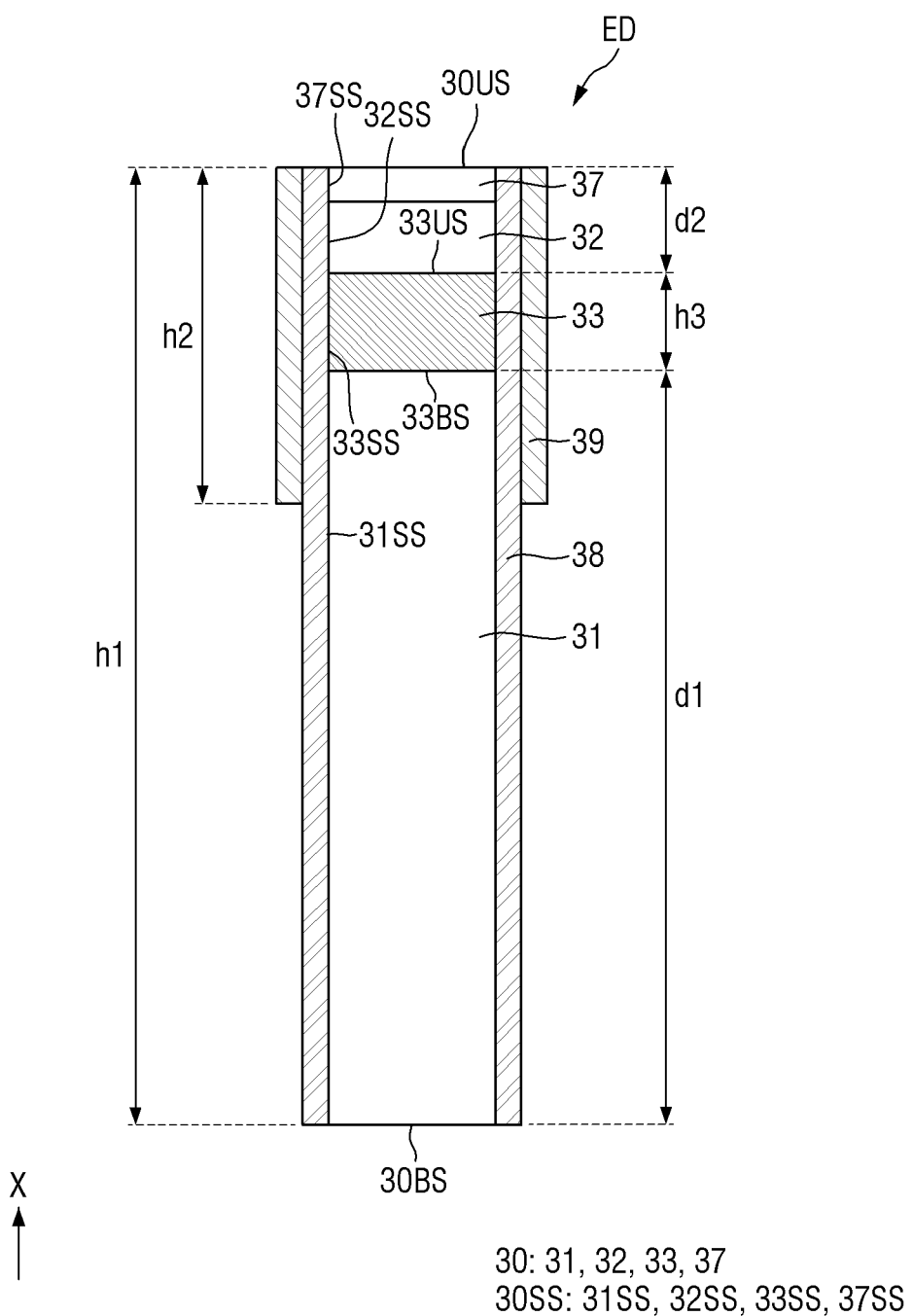
FIG. 6 is a schematic cross-sectional view of the light-emitting element of FIG. 6.

FIG. 5 is a schematic perspective view of a light-emitting element according to an embodiment. FIG. 6 is a schematic cross-sectional view of the light-emitting element of FIG. 6.

The light-emitting element ED, which is a particulate element, may have a rod or cylindrical shape with a predetermined aspect ratio. The light-emitting element ED may extend in a direction X, a length h1 of the light-emitting element ED in the direction X (or a direction of extension or a length direction) may be greater than the diameter of the light-emitting element ED, and the aspect ratio of the light-emitting element ED may be about 6:5 to about 100:1. However, the disclosure is not limited thereto. The direction X, the direction of extension of the light-emitting element ED, and the length direction of the light-emitting element ED may be interchangeably used.

The light-emitting element ED may have a nanometer-scale size of about 1 nm to about 1 μm or a micrometer-scale size of about 1 μm to about 1 mm. In an embodiment, the diameter and the length h1 of the light-emitting element ED may be at a nanometer scale or at a micrometer scale. In another example, the diameter of the light-emitting element ED may be at a nanometer scale, but the length h1 of the light-emitting element ED may be at a micrometer scale. In another example, in a case where there are multiple light-emitting elements ED, some of the light-emitting elements ED may have a nanometer-scale diameter and/or length h1, and some of the light-emitting elements ED may have a micrometer-scale diameter and/or length h1.

In an embodiment, the light-emitting element ED may be an inorganic light-emitting diode. The inorganic light-emitting diode may include semiconductor layers. In an example, the inorganic light-emitting diode may include a semiconductor layer of a first conductivity type (e.g., an n type), a semiconductor layer of a second conductivity type (e.g., a p type), and an active semiconductor layer interposed between the semiconductor layer of the first conductivity type and the semiconductor layer of the second conductivity type. The active semiconductor layer may receive holes and electrons from the semiconductor layer of the first conductivity type and the semiconductor layer of the second conductivity type, respectively, and the holes and the electrons may combine together in the active semiconductor layer. As a result, the light-emitting element ED may emit light.

Referring to FIGS. 5 and 6, the light-emitting element ED may include a light-emitting element core 30 and a reflective film 39. The light-emitting element ED may further include a device insulating film 38.

The light-emitting element core 30 may extend in the direction X. The light-emitting element core 30 may have a rod or cylindrical shape, but the disclosure is not limited thereto. As another example, the light-emitting element core 30 may have the shape of a polygonal column such as a regular hexahedron, a rectangular parallelepiped, or a hexagonal column or may extend in the direction X with part of the outer surface thereof inclined.

The light-emitting element core 30 may have a first surface 30US, a second surface 30BS, and a lateral surface 30SS. The first surface 30US may be a surface of the light-emitting element core 30 on a side of the light-emitting element core 30 in the direction X, and the second surface 30BS may be the other surface of the light-emitting element core 30 on the other side of the light-emitting element core 30 in the direction X. For example, in the example of FIGS. 5 and 6, the first surface 30US may be the top surface of the light-emitting element core 30, and the second surface 30BS may be the bottom surface of the light-emitting element core 30.

In an embodiment, the semiconductor layers of the light-emitting element ED may be sequentially stacked in the length direction of the light-emitting element core 30, for example, in the direction X. As illustrated in FIGS. 5 and 6, the light-emitting element core 30 may include a first semiconductor layer 31, a device active layer 33, and a second semiconductor layer 32, which are sequentially stacked in the direction X. The first semiconductor layer 31, the device active layer 33, and the second semiconductor layer 32 may be the semiconductor layer of the first conductivity type, the active semiconductor layer, and the semiconductor layer of the second conductivity type, respectively.

The first semiconductor layer 31 may be doped with a dopant of the first conductivity type. The dopant of the first conductivity type may be Si, Ge, or Sn. In an embodiment, the first semiconductor layer 31 may be n-GaN doped with an n-type dopant such as Si.

The second semiconductor layer 32 may be spaced apart from the first semiconductor layer 31 by the device active layer 33. The second semiconductor layer 32 may be doped with a dopant of the second conductivity type such as Mg, Zn, Ca, Se, or Ba. In an embodiment, the second semiconductor layer 32 may be p-GaN doped with a p-type dopant such as Mg.

The device active layer 33 may include a material having a single- or multi-quantum well structure. As described above, as electrical signals are applied through the first and second semiconductor layers 31 and 32, the device active layer 33 may emit light by the combination of electron-hole pairs.

In some embodiments, the device active layer 33 may have a structure in which a semiconductor material having large bandgap energy and a semiconductor material having small bandgap energy are alternately stacked, and may include different group III to V semiconductor materials depending on the wavelength of light to be emitted.

Light generated by the device active layer 33 may be emitted not only through both end surfaces of the light-emitting element core 30 in the direction X (for example, the length direction), but also through the lateral surface 30SS of the light-emitting element core 30. In an embodiment, light generated by the device active layer 33 may be emitted to the outside of the light-emitting element core 30 through the first surface 30US, the second surface 30BS, and the lateral surface 30SS of the light-emitting element core 30. The direction in which light is emitted from the light-emitting element core 30, particularly, the device active layer 33, is not particularly limited.

The light-emitting element core 30 may further include a device electrode layer 37, which is disposed on the second semiconductor layer 32. The semiconductor layer 32 may be disposed between the device electrode layer 37 and the device active layer 33. For example, the first semiconductor layer 31, the device active layer 33, the second semiconductor layer 32, and the device electrode layer 37 may be sequentially formed in the direction X. The device electrode layer 37 may contact the second semiconductor layer 32. The device electrode layer 37 may be an ohmic contact electrode, but the disclosure is not limited thereto. As another example, the device electrode layer 37 may be a Schottky contact electrode.

In case that both end portions of the light-emitting element ED and electrodes are electrically connected to apply electrical signals to the first and second semiconductor layers 31 and 32, the device electrode layer 37 may be disposed between the second semiconductor layer 32 and the electrodes and may reduce resistance. The device electrode layer 37 may include at least one of Al, Ti, indium (In), Au, Ag, ITO, IZO, and indium tin zinc oxide (ITZO). The device electrode layer 37 may include a semiconductor material doped with an n- or p-type dopant.

The lateral surface 30SS of the light-emitting element core 30 may include a lateral surface 31SS of the first semiconductor layer 31, a lateral surface 33SS of the device active layer 33, and a lateral surface 32SS of the second semiconductor layer 32. The lateral surface 30SS of the light-emitting element core 30 may further include a lateral surface 37SS of the device electrode layer 37. The lateral surfaces 31SS, 33SS, and 32SS of the first semiconductor layer 31, the device active layer 33, and the second semiconductor layer 32 that form the lateral surface 30SS of the light-emitting element core 30 may be aligned with each other. FIG. 6 illustrates that the lateral surface 37SS of the device electrode layer 37 is aligned with the lateral surface 32SS of the second semiconductor layer 32, but the disclosure is not limited thereto. In an embodiment, the lateral surface 37SS of the device electrode layer 37 may protrude outward beyond the lateral surface 32SS of the second semiconductor layer 32.

The device insulating film 38 may be disposed to surround the lateral surface 30SS of the light-emitting element core 30. The device insulating film 38 may be disposed to surround at least the lateral surface 33SS of the device active layer 33 and may extend in the direction in which the light-emitting element core 30 extends, for example, in the direction X. The device insulating film 38 may protect the first semiconductor layer 31, the second semiconductor layer 32, and the device active layer 33. As the device insulating film 38 includes a material having insulating properties, the device insulating film 38 can prevent a short circuit that may occur in case that the device active layer 33 directly contacts electrodes applying electrical signals to the light-emitting elements ED. Also, as the device insulating film 38 is disposed between the reflective film 39 and the first semiconductor layer 31, the second semiconductor layer 32, and the device active layer 33 of the light-emitting element core 30, the device insulating film 38 can prevent a short circuit that may occur in case that the reflective film 39 is placed in direct contact with the first semiconductor layer 31, the second semiconductor layer 32, and the device active layer 33. Also, as the device insulating film 38 includes the device active layer 33 to protect the lateral surfaces 31SS and 32SS of the first and second semiconductor layers 31 and 32, the device insulating film 38 can prevent the degradation of emission efficiency.

FIG. 6 illustrates that the device insulating film 38 extends in the direction X on the lateral surface 30SS of the light-emitting element core 30 to completely cover (or overlap) the lateral surfaces 31SS, 33SS, 32SS, and 37SS of the first semiconductor layer 31, the device active layer 33, the second semiconductor layer 32, and the device electrode layer 37, but the disclosure is not limited thereto. As another example, the device insulating film 38 may include the device active layer 33 to cover only the lateral surface(s) of only some of the semiconductor layers of the light-emitting element core 30, or to cover part of the lateral surface 37SS of the device electrode layer 37, but expose part of the lateral surface 37SS of the device electrode layer 37, even in which case, the device insulating film 38 may be interposed between at least the light-emitting element core 30 and the reflective film 39. FIG. 6 illustrates that the device insulating film 38 is formed as a single layer, but the disclosure is not limited thereto. As another example, the device insulating film 38 may have a stack of multiple insulating films including an insulating material.

The device insulating film 38 may have an inner circumferential surface (or an inner lateral surface) and an outer circumferential surface (or an outer lateral surface). The inner circumferential surface (or the inner lateral surface) of the device insulating film 38 may be a lateral surface of the device insulating film 38 that faces the lateral surface 30SS of the light-emitting element core 30. Also, the outer circumferential surface (or the outer lateral surface) of the device insulating film 38 may be a lateral surface of the device insulating film 38 that is opposite to the inner circumferential surface (or the inner lateral surface) of the device insulating film 38.

The reflective film 39 may be disposed on the lateral surface 30SS of the light-emitting element core 30. The reflective film 39 may be disposed to surround part of the lateral surface 30SS of the light-emitting element core 30. The reflective film 39 may be disposed to surround the lateral surface 30SS of the light-emitting element core 30, but expose at least part of the lateral surface 30SS of the light-emitting element core 30. The reflective film 39 may not be disposed at least on the lateral surface of one of two end portions (or first and second end portions) of each of the light-emitting element core 30. For example, the reflective film 39 may be disposed on the lateral surface of a first end portion of the light-emitting element core 30 where the second semiconductor layer 32 is disposed, but not on the lateral surface of the second end portion of the light-emitting element core 30 where the first semiconductor layer 31 is disposed, with the device active layer 33 between the first semiconductor layer 31 and the second semiconductor layer 32.

The reflective film 39 may be disposed at least on the lateral surface 33SS of the device active layer 33 to surround the lateral surface 33SS of the device active layer 33. The reflective film 39 may be disposed on the lateral surface 33SS of the device active layer 33 to completely cover (or overlap) the lateral surface 33SS of the device active layer 33. The reflective film 39 may extend in the direction X on the lateral surface 33SS of the device active layer 33 and may be disposed even on part of the lateral surface 31SS of the first semiconductor layer 31 and on the lateral surface 32SS of the second semiconductor layer 32.

The reflective film 39 may be disposed on the outer lateral surface of the device insulating film 38. The reflective film 39 may be disposed to surround the outer lateral surface of the device insulating film 38, which surrounds at least the lateral surface 33SS of the device active layer 33. The reflective film 39 may extend in the direction X on the outer lateral surface of the device insulating film 38, which surrounds the lateral surface 33SS of the device active layer 33.

The reflective film 39 may reflect light generated by the device active layer 33 and emitted through the lateral surface 30SS of the light-emitting element core 30. As the reflective film 39 is disposed on the outer lateral surface of the device insulating film 38, the reflective film 39 can change the traveling direction of light proceeding toward the outer lateral surface of the device insulating film 38. For example, as the reflective film 39 is disposed on part of the lateral surface 30SS of the light-emitting element core 30, the amount of light emitted through the lateral surface of the light-emitting element ED, among beams of light generated by the device active layer 33, can be reduced, and the amount of light emitted through both end surfaces of the light-emitting element ED, among the beams of light generated by the device active layer 33, can be increased. The traveling direction of light emitted by the device active layer 33 will be described below.

The reflective film 39 may include a reflective material. For example, the reflective film 39 may be formed of a metallic material with high reflectance such as Al, Ni, Ag, or La or may include a material with high reflectance such as barium sulfate (BaSO$_x$), but the disclosure is not limited thereto.

To maximize the amount of light emitted through both end surfaces of the light-emitting element ED, the device active layer 33 and the reflective film 39 may be appropriately arranged in the light-emitting element ED. The locations and the thicknesses (or the lengths in the direction X) of the elements of the light-emitting element core 30 relative to the location and the length (or the length in the direction X) of the reflective film 39 will hereinafter be described in detail.

Light generated by the device active layer 33 of the light-emitting element core 30 may be emitted to the outside of the light-emitting element core 30 through a top surface 33US, a bottom surface 33BS, and the lateral surface 33SS of the device active layer 33. Therefore, as the reflective film 39 is disposed to completely surround the lateral surface 33SS of the device active layer 33, light emitted from the device active layer 33 through the lateral surface 30SS of the light-emitting element core 30 can be induced to be emitted through both end surfaces of the light-emitting element core 30.

A length h2 of the reflective film 39 in the direction X may be smaller than the length h1 of the light-emitting element core 30 in the direction X. As the length h2 of the reflective film 39 in the direction X is smaller than the length h1 of the light-emitting element core 30 in the direction X, electrodes applying electrical signals to the light-emitting elements ED can be prevented from being short-circuited even in case that the electrodes directly contact both end portions of each of the light-emitting elements ED.

The length h2 of the reflective film 39 in the direction X may be greater than a thickness h3 of the device active layer 33 in the direction X. As the length h2 of the reflective film 39 in the direction X is greater than the thickness h3 of the device active layer 33 in the direction X, the efficiency of reflection of light traveling toward the lateral surface 30SS of the light-emitting element core 30 through the lateral surface 33SS of the device active layer 33 can be increased. Specifically, as the device active layer 33 generates light in the light-emitting element core 30, light emitted through the lateral surface 33SS of the device active layer 33 may account for a large portion of light emitted from the entire lateral surface 30SS of the light-emitting element core 30. Therefore, as the reflective film 39 is disposed to completely surround the lateral surface 33SS of the device active layer 33, the amount of light emitted through both end surfaces of the light-emitting element core 30 can be increased by reflecting light traveling toward the lateral surface 30SS of the light-emitting element core 30 through the lateral surface 33SS of the device active layer 33.

The device active layer 33 may be disposed close to a side of the light-emitting element core 30 from the middle of the light-emitting element core 30 in the direction X. The first semiconductor layer 31 may be formed to account for the most part of the light-emitting element ED.

Specifically, the length of the first semiconductor layer 31 in the direction X may be greater than the lengths of the second semiconductor layer 32 and the device electrode layer 37 in the direction X. Also, the length of the first semiconductor layer 31 in the direction X may be greater than the sum of the lengths of the second semiconductor layer 32 and the device active layer 37 in the direction X.

The device active layer 33 may be disposed close to a side of the light-emitting element ED in the direction X, for example, to a side where the second semiconductor layer 32 is disposed, from the middle of the light-emitting element ED in the direction X. For example, a distance d2 between the first surface 30US of the light-emitting element core 30 and the top surface 33US of the device active layer 33 may be smaller than a distance d1 between the second surface 30BS of the light-emitting element 30 and the bottom surface 33BS of the device active layer 33. As the device active layer 33 is disposed close to a side of the light-emitting element ED in the length direction, the intensity of light emitted through both end portions of the device active layer 33 may be greater at the first end portion than at the second end portion of the light-emitting element core 30. In other words, as the device active layer 33, which generates light, is disposed close to a side of the light-emitting element core 30, the intensity of light emitted from the light-emitting element core 30 can be asymmetrical in a plan view.

Therefore, the amount of light emitted through both end surfaces of the light-emitting element ED can be maximized by the reflective film 39 formed at the first end portion of the light-emitting element core 30 at which the device active layer 33, in which the intensity of light emitted from the light-emitting element core 30 is relatively large, is disposed adjacent to the side of the light-emitting element ED.

Figure 7:
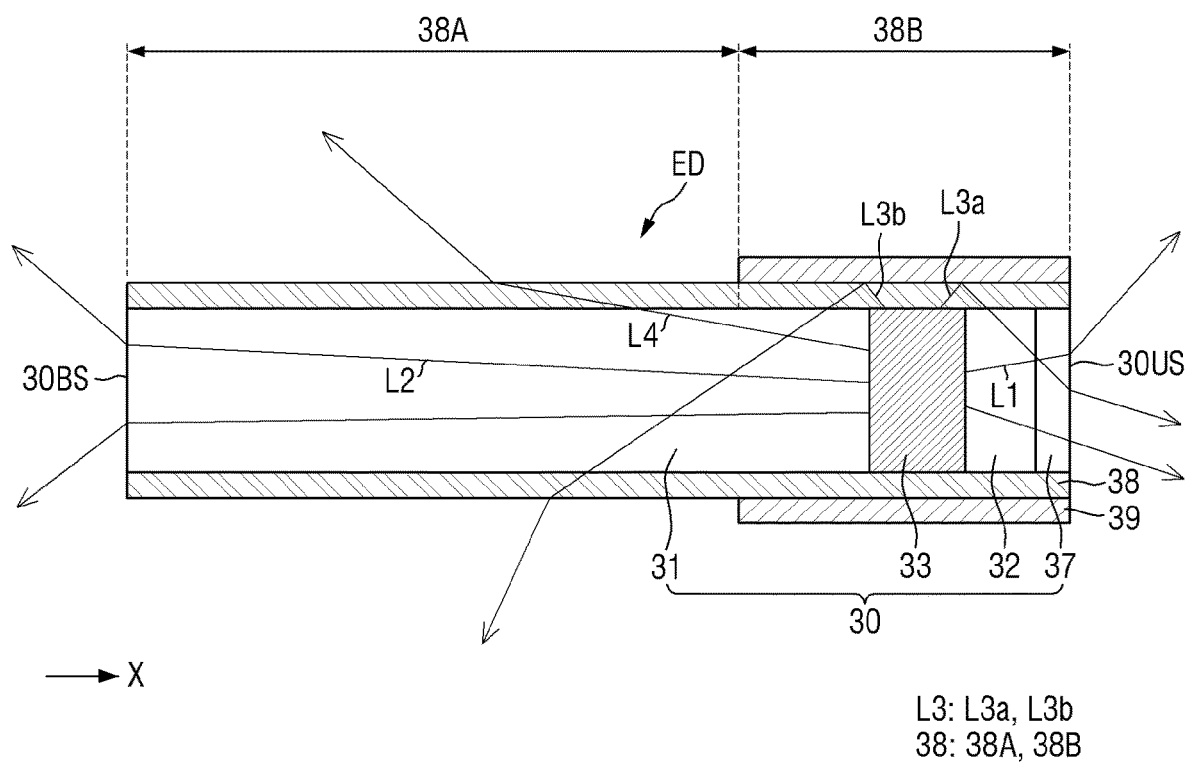
FIG. 7 is a schematic cross-sectional view illustrating the traveling direction of light emitted from the light-emitting element of FIG. 5.

FIG. 7 is a schematic cross-sectional view illustrating the traveling direction of light emitted from the light-emitting element of FIG. 5.

Referring to FIGS. 6 and 7, among beams of light generated by the device active layer 33, light L1 may be emitted to the outside of the light-emitting element ED through the first surface 30US of the light-emitting element ED where the device electrode layer 37 is disposed, and light L2 may be emitted to the outside of the light-emitting element ED through the second surface 30BS of the light-emitting element core 30 where the first semiconductor layer 31 is disposed. Among beams of beams of light generated by the device active layer 33 and emitted through the lateral surface 30SS of the light-emitting element core 30, light L3 traveling toward a first area 38B of the device insulating film 38, which is surrounded by the reflective film 39, may be reflected from the inner lateral surface of the reflective film 39 through the device insulating film 38 to travel toward an inner side of the light-emitting element core 30. Some of the light L3, for example, light L3a, may be emitted to the outside of the light-emitting element ED through the first surface 30US of the light-emitting element core 30, and some of the light L3, for example, light L3b, may be emitted to the outside of the light-emitting element ED through a second area 38A of the device insulating film 38, which is exposed by the reflective film 39. Among the beams of light generated by the device active layer 33 and emitted through the lateral surface 30SS of the light-emitting element core 30, light LA traveling toward the second area 38A of the device insulating film 38 may be emitted to the outside of the light-emitting element ED through the second area 38A of the device insulating film 38.

As the intensity of light emitted from the light-emitting element core 30 is large and the reflective film 39 is formed to surround the lateral surface 33SS of the device active layer 33, which generates light, the amount of light emitted through both end surfaces of the light-emitting element ED can be maximized.

FIGS. 8 to 19 are schematic cross-sectional views illustrating a method of fabricating a light-emitting element according to an embodiment.

Fourth and fifth directions DR4 and DR5 are defined in FIGS. 8 to 19. The fourth and fifth directions DR4 and DR5 may be perpendicular to each other. The fifth direction DR5 may be parallel to a direction in which light-emitting elements ED formed on a base substrate 1100 extend, for example, the direction X. Unless specified otherwise, the terms "on," "above," and "upper," as used herein, refer to a direction in which semiconductor layers are stacked in each of the light-emitting elements ED, with respect to a surface (or the top surface) of the base substrate 1100, the term "top surface," as used herein, refers to a surface that faces a side in the fifth direction DR5, the terms "below" and "lower," as used herein, refer to the opposite direction of the fifth direction DR5, and the term "bottom surface" as used herein, refers to a surface that faces the opposite direction of the fifth direction DR5.

Figure 8:
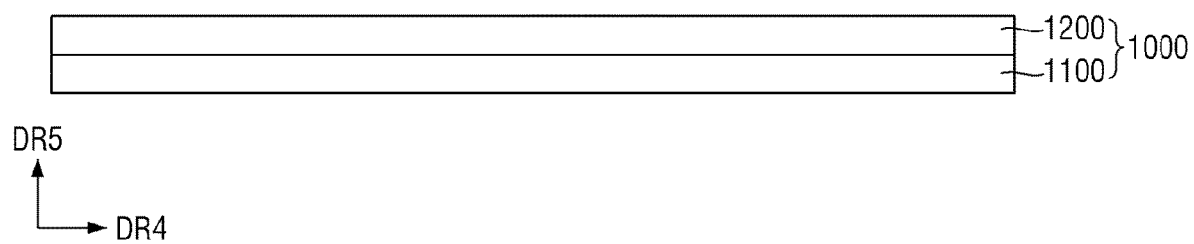

Referring to FIG. 8, a lower substrate 1000 is prepared.

Specifically, the lower substrate 1000 may include the base substrate 1100 and a buffer material layer 1200, which is disposed on the base substrate 1100.

The base substrate 1100 may be a transparent substrate such as a sapphire ($Al_xO_y$) substrate or a glass substrate. In an embodiment, the base substrate 1100 may be a sapphire substrate.

The buffer material layer 1200 may be disposed on the surface (or the top surface) of the base substrate 1100. The buffer material layer 1200 may reduce the difference in lattice constant between the base substrate 1100 and a first semiconductor material layer 3100 (see FIG. 9). The buffer material layer 1200 may include an undoped semiconductor. The buffer material layer 1200 and the first semiconductor material layer 3100 may include the same material, and the buffer layer 1200 may include a material not doped with a first or second conductivity-type dopant, for example, an n- or p-type dopant. FIG. 8 illustrates that the buffer material layer 1200 is formed as a single layer, but the buffer material layer 1200 is formed as a multi-layer.

The buffer material layer 1200 may not be provided depending on the type of the base substrate 1100.

Figure 9:

Thereafter, referring to FIG. 9, a first stack structure 3000 is formed on the lower substrate 1000.

Specifically, in an embodiment where the buffer material layer 1200 is formed on the base substrate 1100, the first stack structure 3000, in which the first semiconductor material layer 3100, a device active material layer 3300, a second semiconductor material layer 3200, and an electrode material layer 3700 are sequentially stacked, is formed on the buffer material layer 1200. The material layers included in the first stack structure 3000 may be formed by typical processes.

The material layers included in the first stack structure 3000 may correspond to layers included in each of light-emitting element cores 30 to be formed. Specifically, the first semiconductor material layer 3100, the device active material layer 3300, the second semiconductor material layer 3200, and the electrode material layer 3700 of the first stack structure 3000 may correspond to, and include the same materials as, first semiconductor layers 31, device active layers 33, second semiconductor layers 32, and device electrode layers 37, respectively, of the light-emitting element cores 30 to be formed.

Figure 10:
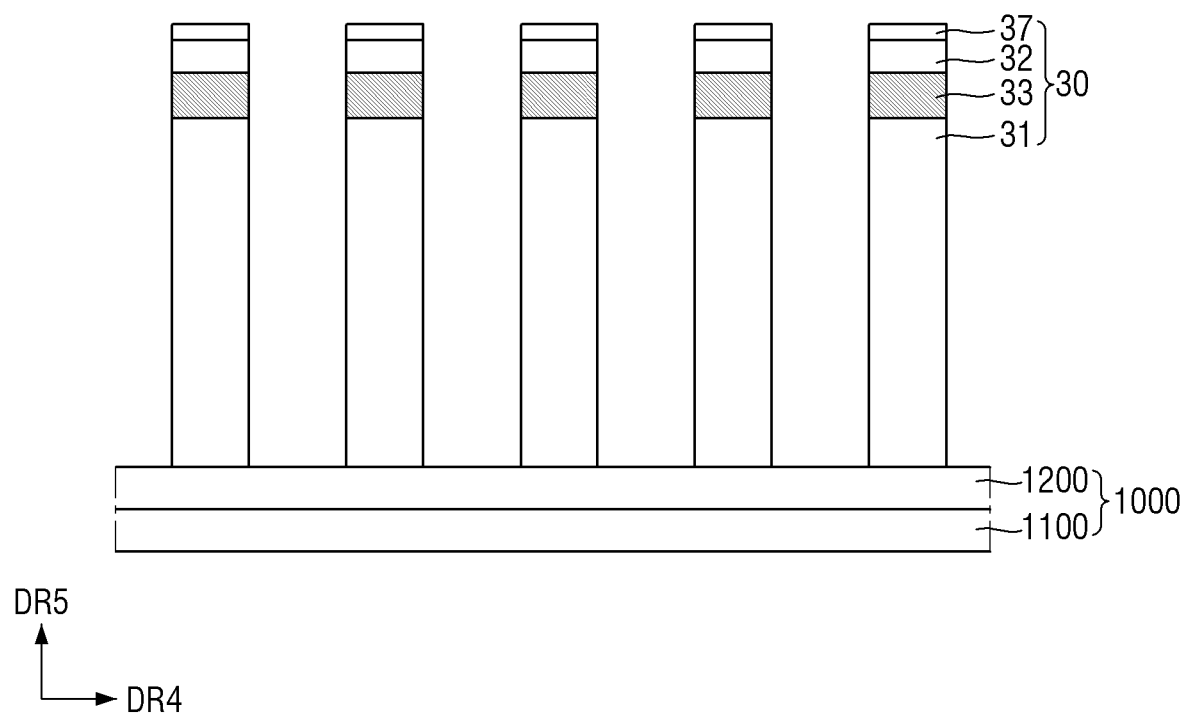

Thereafter, referring to FIGS. 9 and 10, light-emitting element cores 30, which are spaced apart from one another, are formed on the lower substrate 1000 by etching the first stack structure 3000.

Specifically, the light-emitting element cores 30, which are spaced apart from one another, are formed by etching the first stack structure 3000 in a direction perpendicular to the surface of the base substrate 1100, for example, in the fifth direction DR5.

The etching of the first stack structure 3000 to form the light-emitting element cores 30 may be performed by a typical method. In an embodiment, the light-emitting element cores 30 may be formed by forming an etching mask layer on the first stack structure 3000 and etching the first stack structure 3000 along the etching mask layer in the direction perpendicular to the surface of the base substrate 1100, for example, in the fifth direction DR5.

In an embodiment, the etching of the first stack structure 3000 to form the light-emitting element cores 30 may be performed by dry etching, wet etching, reactive ion etching (RIE), or inductively coupled plasma-reactive ion etching (ICP-RIE). In an embodiment, an etch process for forming the light-emitting element cores 30 so that the lateral surfaces of the light-emitting element cores 30 may be perpendicular to the surface of the base substrate 1100 may be performed by dry etching and wet etching. Specifically, the first stack structure 3000 may be etched in the fifth direction DR5 by dry etching, which is anisotropic etching, and may be etched by wet etching, which is isotropic etching, so that the side surfaces of the etched first stack structure 3000 may fall on planes perpendicular to the surface of the base substrate 1100. As a result, the lateral surfaces of a first semiconductor layer 31, a device active layer 33, and a second semiconductor layer 32 included in each of the light-emitting element cores 30 may all be aligned with each other.

The light-emitting element cores 30 may be spaced apart from one another on the buffer material layer 1200. Each of the light-emitting element cores 30 may include the first semiconductor layer 31, the device active layer 33, the second semiconductor layer 32, and a device electrode layer 37, which are sequentially stacked on the buffer material layer 1200 in an upward direction (i.e., in the fifth direction DR5).

Figure 11:
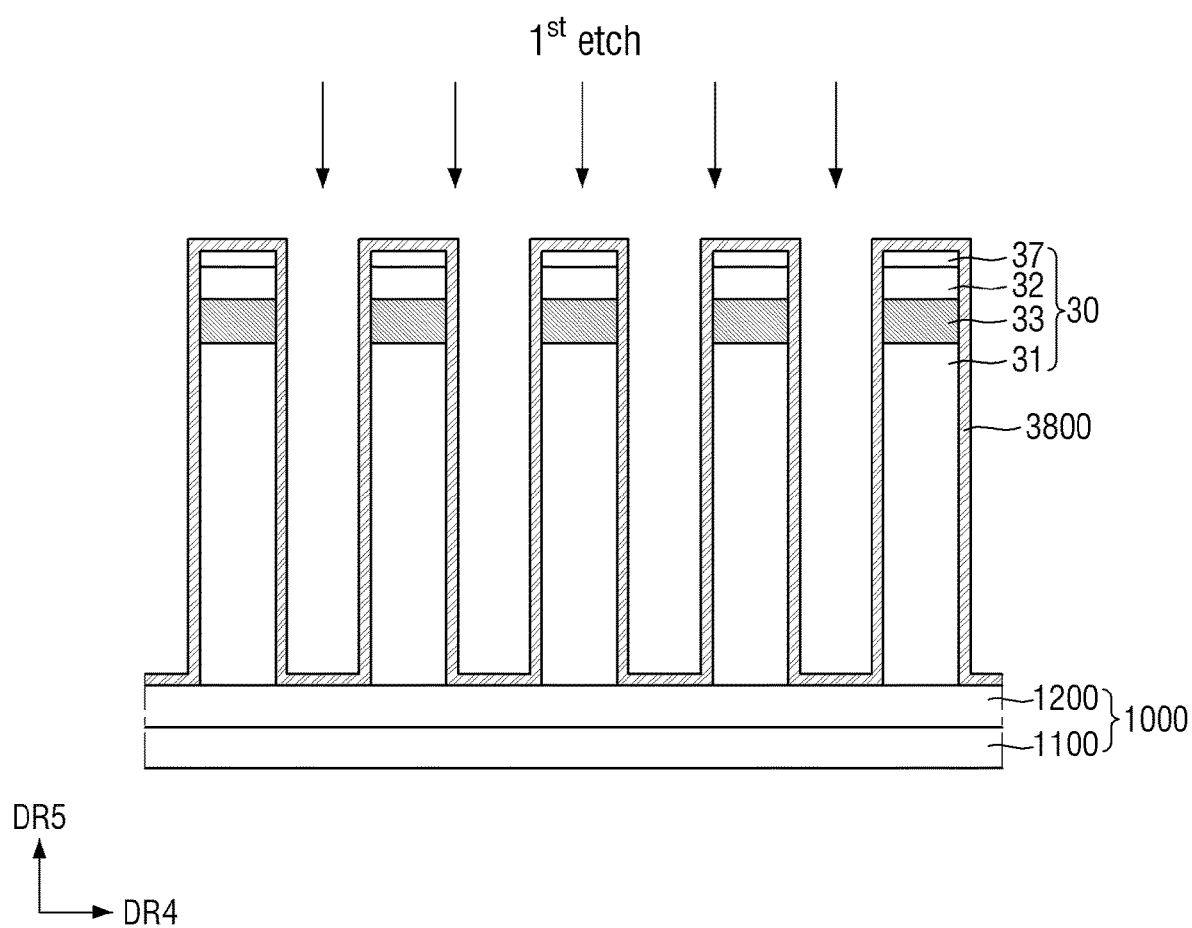

Thereafter, referring to FIG. 11, an insulating material layer 3800 is formed on the light-emitting element cores 30.

Specifically, the insulating material layer 3800 is formed on the outer surfaces of each of the light-emitting element cores 30. The insulating material layer 3800 may be formed on the entire surface of the base substrate 1100, for example, not only on the outer surfaces of each of the light-emitting element cores 30, but also on parts of the top surface of the buffer material layer 1200 exposed by the light-emitting element cores 30. The outer surfaces of each of the light-emitting element cores 30 may include the lateral surface and the top surface of each of the light-emitting element cores 30. The insulating material layer 3800 may correspond to, and include the same material as, device insulating films 38 of light-emitting elements ED to be formed.

Figure 12:
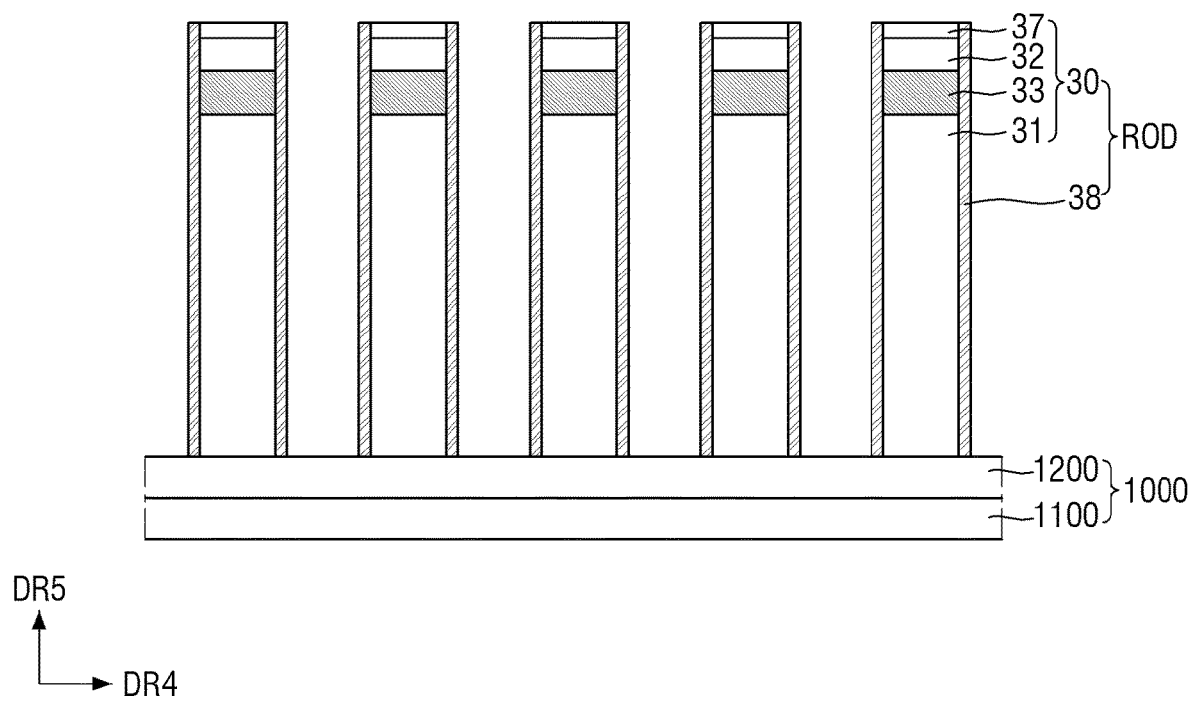

Thereafter, referring to FIGS. 11 and 12, device rods ROD are formed by performing a first etch process that removes parts of the insulating material layer 3800.

The first etch process that removes parts of the insulating material layer 3800 may be performed to expose the top surfaces of the light-emitting element cores 30 and surround the lateral surfaces of the light-emitting element cores 30. Specifically, parts of the insulating material layer 3800 may be removed so that the top surfaces of the device electrode layers 37 of the light-emitting element cores 30 may be exposed. The removal of parts of the insulating material layer 3800 may be performed by dry etching or etch-back, which is anisotropic etching. During the first etch process, parts of the insulating material layer 3800 disposed on the exposed parts of the buffer material layer 1200 between the light-emitting element cores 30 may also be removed. As a result of the first etch process, the device rods ROD may be formed. The device rods ROD may include the light-emitting element cores 30 and device insulating films 38, which surround the lateral surfaces of the light-emitting element cores 30.

Figure 13:
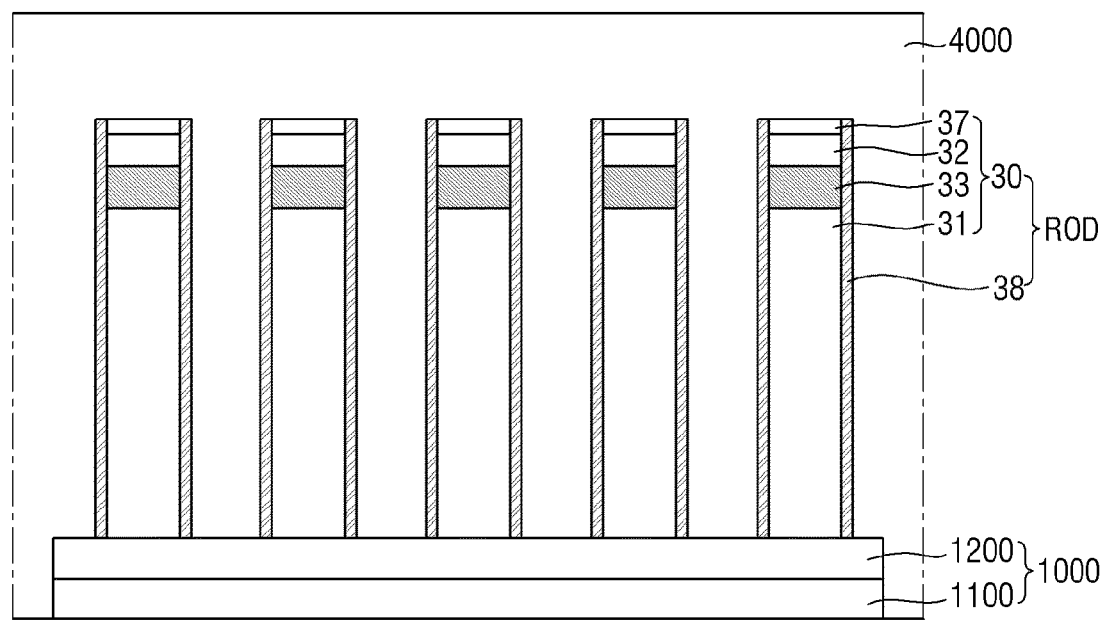

Thereafter, referring to FIG. 13, a first binder material layer 4000, which surrounds the outer surfaces of each of the device rods ROD, is formed on the lower substrate 1000.

Specifically, the first binder material layer 4000 may be formed to surround the device rods ROD. The first binder material layer 4000 may be disposed to cover (or overlap) the top surfaces of the device rods ROD. For example, the first binder material layer 4000 may be formed so that the device rods ROD may be disposed in the first binder material layer 4000.

The top surface of the first binder material layer 4000 may be substantially flat and may thus form a parallel plane with the lower substrate 1000. The bottom surface of the first binder material layer 4000 may be formed to contact the top surface of the buffer material layer 1200 of the lower substrate 1000. Also, the first binder material layer 4000 may be disposed to completely cover (or overlap) the side surfaces of the lower substrate 1000, but the disclosure is not limited thereto. As another example, the first binder material layer 4000 may be disposed only on the top surface of the buffer material layer 1200.

The first binder material layer 4000 may be formed to completely fill the spaces between the device rods ROD, which are formed on the lower substrate 1000. The first binder material layer 4000 may be formed to completely fill the spaces between the device rods ROD and thus to affix the device rods ROD.

The first binder material layer 4000 may be formed by applying or spraying the material of the first binder material layer 4000 on the device rods ROD. In an embodiment, the first binder material layer 4000 may be formed by inkjet printing, spin coating, die-slot coating, or slit coating, but the disclosure is not limited thereto.

The first binder material layer 4000 may include an insulating material. The insulating material may be an inorganic insulating material or an organic insulating material. Examples of the inorganic insulating material may include a polymer and a nitride-based inorganic material such as silicon nitride ($SiN_x$) or aluminum nitride (AlN). The polymer may be a photosensitive polymer such as poly(methyl methacrylate) (PMMA) or poly(methyl glutarimide) (PMGI), but the disclosure is not limited thereto. Examples of the organic insulating material may include PI, but the disclosure is not limited thereto.

Figure 14:
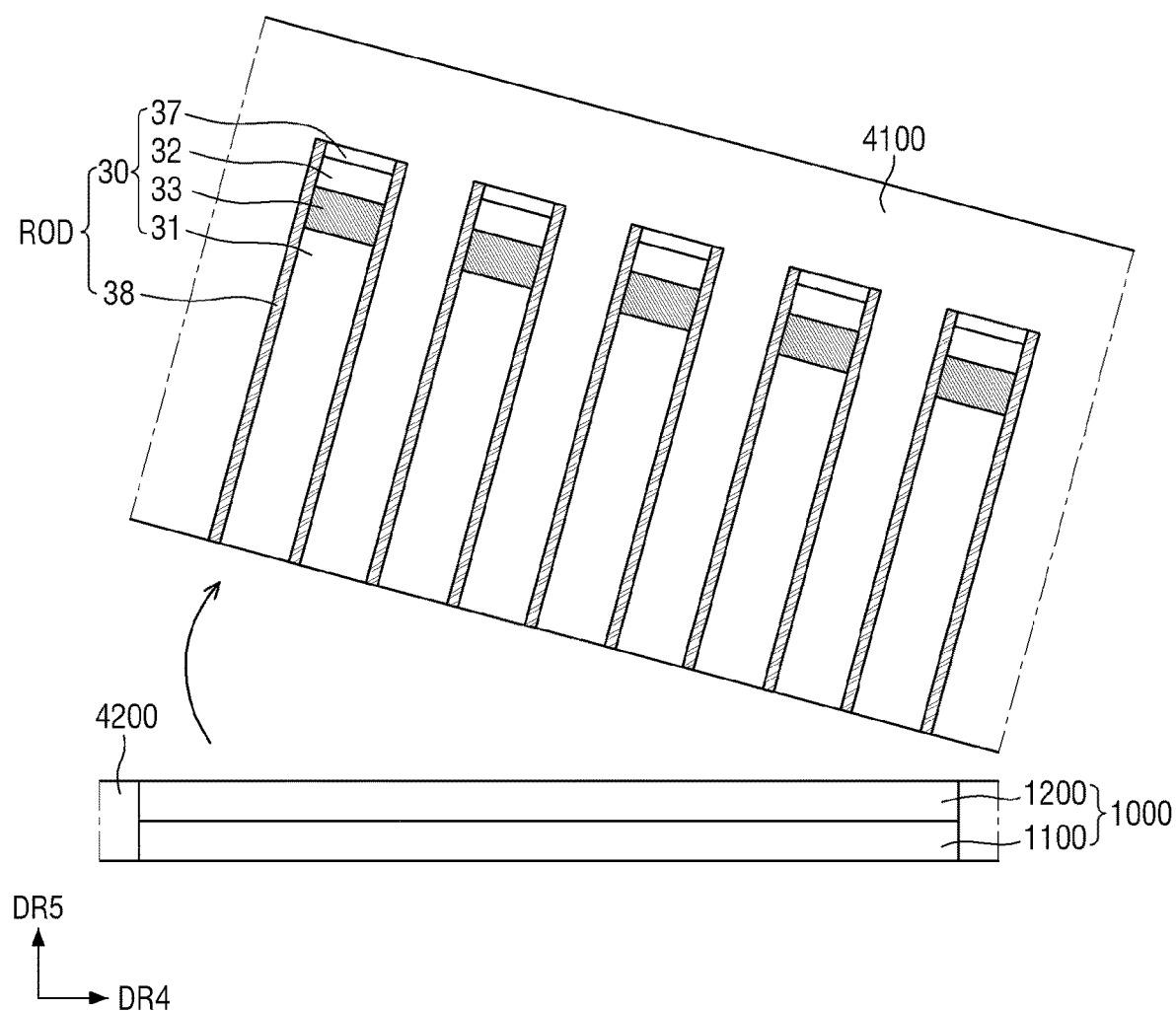

Thereafter, referring to FIG. 14, the first binder material layer 4000 and the device rods ROD, which are affixed by being disposed in the first binder material layer 4000, may be separated from the lower substrate 1000.

Specifically, a method to separate the first binder material 4000 and the device rods ROD is not particularly limited. In an embodiment, the separation of the first binder material 4000 and the device rods ROD from the lower substrate 1000 may be performed by a physical or chemical separation method. As a result of the physical or chemical separation method, the device rods ROD, which are affixed by the first binder material layer 4000, may be separated from the lower substrate 1000 together with the first binder material layer 4000.

As the first binder material layer 4000 is formed to surround the outer surfaces of each of the device rods ROD, the first binder material layer 4000 can protect and affix the device rods ROD and can thus allow the device rods ROD to be separated from the lower substrate 1000 together with the first binder material layer 4000. As a result, the first binder layer 4000 can be divided into a first area 4100, which surrounds the entire outer surfaces of each of the device rods ROD, and a second area 4200, which is disposed on the sides of the lower substrate 1000.

As the device rods ROD are separated together, rather than individually, because of the first binder material layer 4000, damage to the first semiconductor layers 31 of the light-emitting element cores 30 can be prevented.

Figure 16:
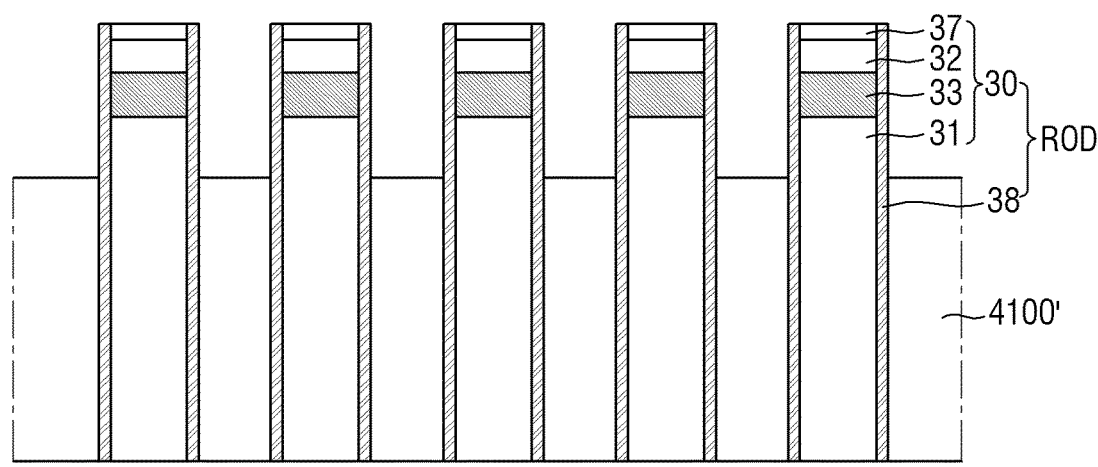

Thereafter, referring to FIGS. 15 and 16, parts of the device rods ROD are exposed by performing a second etch process that removes parts of the first area 4100.

Specifically, a second etch process that removes part of the first area 4100 where the device active material layer 3300 is disposed is performed, as illustrated in FIG. 15, thereby forming a second binder material layer 4100', which exposes parts of the device rods ROD, as illustrated in FIG. 16. The second etch process may etch the first area 4100 in the direction in which the light-emitting element cores 30 extend, for example, in the fifth direction DR5, from above the first area 4100 in which the device electrode layers 37 are disposed. The second binder material layer 4100', which is obtained by the second etch process, may expose the device active layers 33, the second semiconductor layers 32, and the device electrode layers 37 of the light-emitting element cores 30. Also, the second binder material layer 4100' may expose parts of the device insulating films 38 surrounding the lateral surfaces of the device active layers 33, the lateral surfaces of the second semiconductor layers 32, and the lateral surfaces of the device electrode layers 37. The device insulating film 38, which is obtained by the second etch process, may include parts surrounded by the second binder material layer 4100' and parts exposed by the second binder material layer 4100'. The parts of the device insulating films 38 surrounded by the second binder material layer 4100' may surround the lateral surfaces of the first semiconductor layers 31, and the parts of the device insulating films 38 exposed by the second binder material layer 4100' may surround the lateral surfaces of the device active layers 33, the lateral surfaces of the second semiconductor layers 32, and the lateral surfaces of the device electrode layers 37. The parts of the device insulating films 38 exposed by the second binder material layer 4100' may also include parts surrounding the lateral surfaces of the first semiconductor layers 31. Therefore, the thickness of the second binder material layer 4100' in the fifth direction DR5 may be smaller than the length of the light-emitting element cores 30 in the fifth direction DR5.

Thereafter, referring to FIG. 17, a reflective material layer 3900 is formed on the second binder material layer 4100' and the device rods ROD.

Specifically, the reflective material layer 3900 is formed on the second binder material layer 4100' and parts of the device rods ROD exposed by the second binder material layer 4100'. The reflective material layer 3900 is formed on the entire surface of the second binder material layer 4100', e.g., not only on the outer surfaces of each of the device rods ROD, but also on a top surface 4100'US of the second binder material layer 4100 around each of the device rods ROD.

Parts of the outer surfaces of each of the device rods ROD exposed by the second binder material layer 4100' may include parts of the lateral surfaces of the device rods ROD exposed by the second binder material layer 4100' and the top surfaces of the device rods ROD. Specifically, the reflective material layer 3900 may be formed to completely cover (or overlap) not only parts of the outer lateral surfaces of the insulating films 38 of the device rods ROD exposed by the second binder material layer 4100', but also the top surfaces of the light-emitting element cores 30. The reflective material layer 3900 may be formed to completely cover parts of the insulating films 38 surrounding the device active layers 33, the second semiconductor layers 22, and the device electrode layers 37 of the light-emitting element cores 30. The reflective material layer 3900 may correspond to, and include the same material as reflective films 39 of the light-emitting elements ED to be formed. For example, the reflective material layer 3900 may be formed to completely cover the top surfaces of the device electrode layers 37, the lateral surfaces of the device electrode layers 37, the lateral surfaces of the second semiconductor layers 32, and the lateral surfaces of the device active layers 33.

Figure 18:
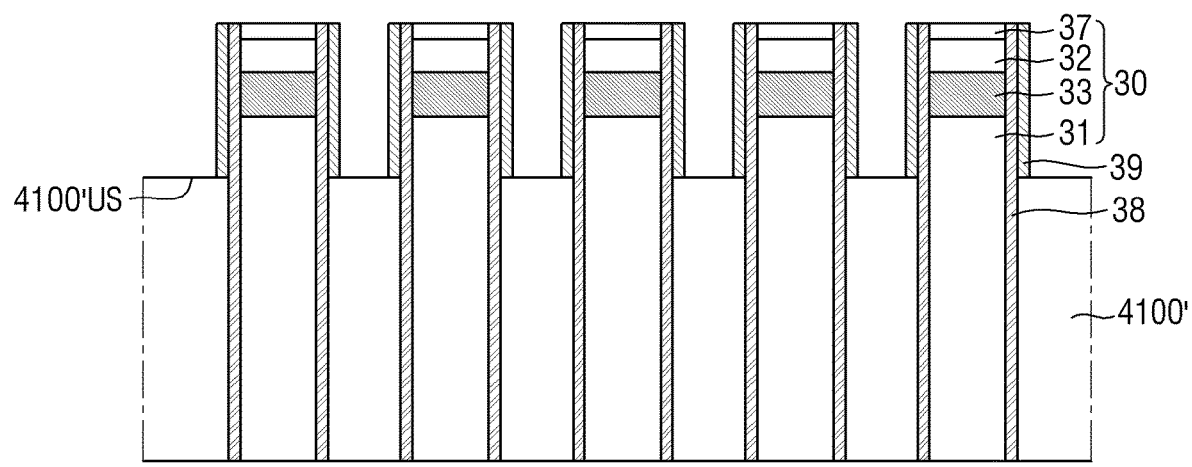

Thereafter, referring to FIGS. 17 and 18, the reflective films 39 are formed by performing a third etch process that removes parts of the reflective material layer 3900.

Specifically, the third etch process may etch the reflective material layer 3900 in the fifth direction DR5, from above the reflective material layer 3900. The third etch process may be performed on the entire surface of the second binder material layer 4100'. Accordingly, parts of the reflective material layer 3900 formed on the top surfaces of the light-emitting element cores 30 and on the top surfaces of the insulating films 38 may be removed by the third etch process. Also, parts of the reflective material layer 3900 formed between the device rods ROD, on the top surface 4100'US of the second binder material layer 4100', may be removed by the third etch process. As parts of the reflective material layer 3900 are removed by the third etch process, the reflective films 39, which surround the outer lateral surfaces of the device insulating films 38, may be formed. The bottom surfaces of the reflective films 39 may adjoin, and contact, the top surface 4100'US of the second binder material layer 4100'. The length of the reflective films 39 in the fifth direction DR5 may be the same as the length of parts of the light-emitting element cores 30 exposed by the second binder material layer 4100'.

Figure 19:
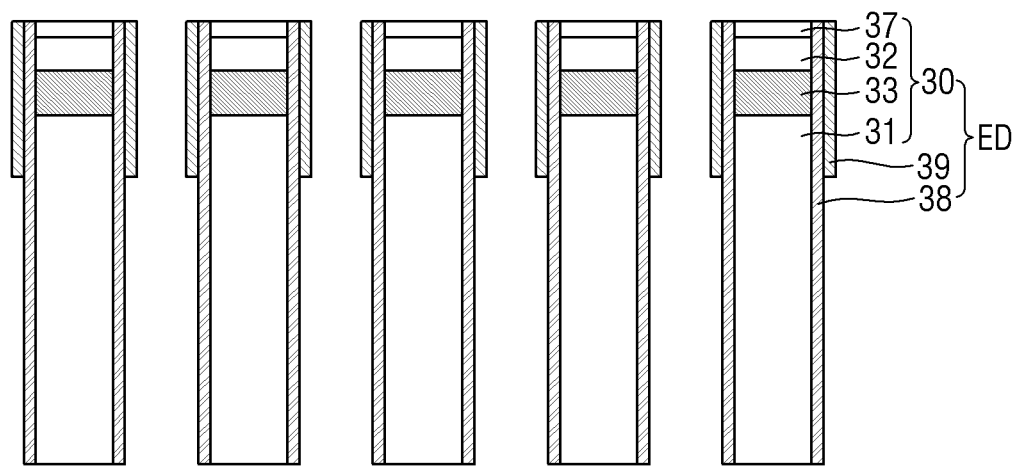

Thereafter, referring to FIG. 19, light-emitting elements ED are formed by removing the second binder material layer 4100'. The removal of the second binder material layer 4100' may include etching the second binder material layer 4100'.

Figure 20:
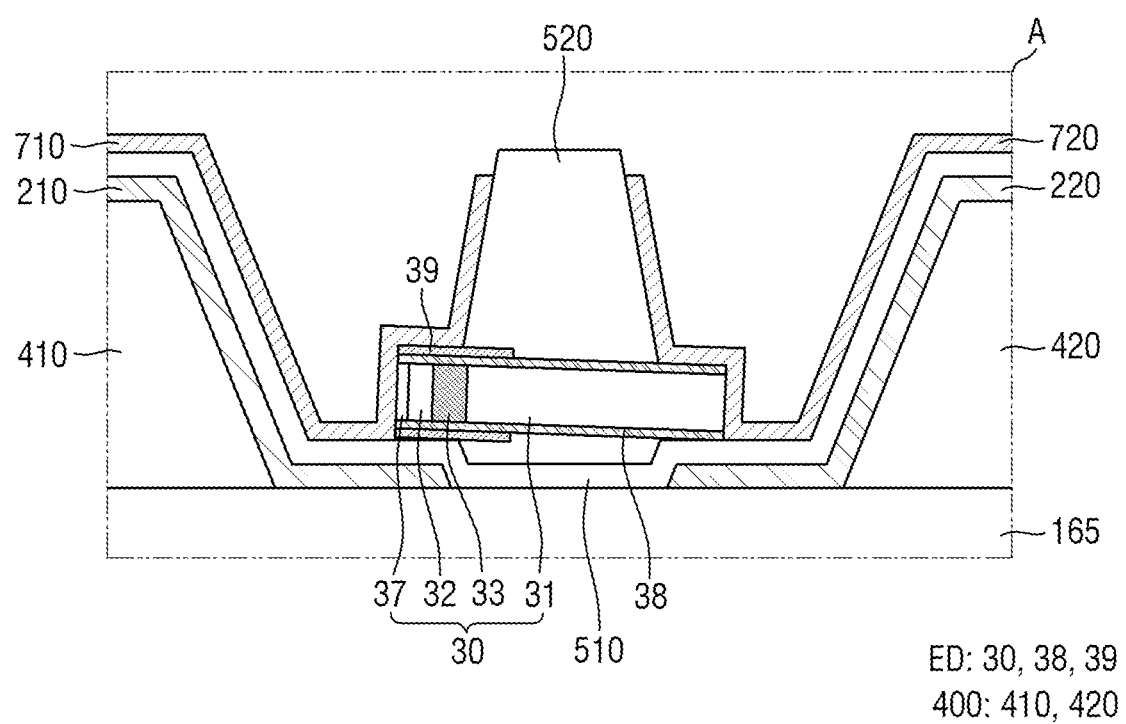
FIG. 20 is a schematic enlarged cross-sectional view of an area A of FIG. 3.

FIG. 20 is a schematic enlarged cross-sectional view of area A of FIG. 3.

Referring to FIG. 20, a light-emitting element ED may be disposed between the first and second electrodes 210 and 220 such that a direction in which the light-emitting element ED extends may be parallel to a surface of the substrate SUB (or the via layer 165). Thus, semiconductor layers included in a light-emitting element core 30 of the light-emitting element ED may be sequentially disposed in a direction parallel to the top surface of the substrate SUB. In one example, a direction in which a first semiconductor layer 31, a device active layer 33, and a second semiconductor layer 32 of the light-emitting element ED are stacked may be parallel to the top surface of the substrate SUB.

Specifically, the first semiconductor layer 31, the device active layer 33, the second semiconductor layer 32, and the device electrode layer 37 of the light-emitting element ED may be sequentially formed in the direction parallel to the top surface of the substrate SUB.

The light-emitting element ED may be disposed between the first and second electrodes 210 and 220 such that first and second end portions of the light-emitting element ED where the second semiconductor layer 32 and the first semiconductor layer 31 are respectively disposed may be placed on the first and second electrodes 210 and 220, respectively. A reflective film 39 may be disposed on the first electrode 210, but not on the second electrode 220. As the first and second end portions of the light-emitting element ED are disposed on the first and second electrodes 210 and 220, first and second end surfaces of the light-emitting element ED may face side surfaces of the first and second sub-banks 410 and 420, respectively. Thus, the first end surface of the light-emitting element ED may face part of the first electrode 210 disposed on the side surface of the first sub-bank 410, and the second end surface of the light-emitting element ED may face part of the second electrode 220 disposed on the side surface of the second sub-bank 420. The lateral surface of the light-emitting element ED may generally be disposed in the area between the first and second electrodes 210 and 220.

The second insulating layer 520 may be disposed on the light-emitting element ED to expose both end portions of the light-emitting element ED. The second insulating layer 520 may be disposed to surround the outer surfaces of the light-emitting element ED. For example, the second insulating layer 520 may be disposed to surround the lateral surface of the reflective film 39 and part of the lateral outer surface of a device insulating film 38 exposed by the reflective film 39.

The reflective film 39 may not be disposed on at least one end portion of the light-emitting element ED exposed by the second insulating layer 520. As the reflective film 39 is not disposed on at least one end portion of the light-emitting element ED exposed by the second insulating layer 520, the first and second contact electrodes 710 and 720 can be prevented from being short-circuited, even though the first and second contact electrodes 710 and 720 contact first and second end portions, respectively, of the light-emitting element ED exposed by the second insulating layer 520.

The second insulating layer 520 may be disposed to cover (or overlap) at least one end portion of the reflective film 39. As the second insulating layer 520 is disposed to cover at least one end portion of the reflective film 39 that faces the first semiconductor layer 31, the reflective film 39 may be disposed on the first end portion of the light-emitting element ED exposed by the second insulating layer 520, but not on the second end portion of the light-emitting element ED exposed by the second insulating layer 520. For example, the outer lateral surface of the first end portion of the light-emitting element ED may be the reflective film 39, and the outer lateral surface of the second end portion of the light-emitting element ED may be the device insulating film 38.

The first contact electrode 710 may be disposed on the first electrode 210 and the first end portion of the light-emitting element ED. The first contact electrode 710 may contact the first end portion of the light-emitting element ED. Specifically, the first contact electrode 710 may contact the outer lateral surfaces of a device electrode layer 37 and the reflective film 39.

The second contact electrode 720 may be disposed on the second electrode 220 and the second end portion of the light-emitting element ED. The second contact electrode 720 may contact the second end portion of the light-emitting element ED. Specifically, the second contact electrode 720 may contact the outer lateral surfaces of the first semiconductor layer 31 and the device insulating film 38. The second contact electrode 720 may not contact the reflective film 39.

The first and second contact electrodes 710 and 720 may be spaced apart from each other by the second insulating layer 520. The first contact electrode 710 may contact the reflective film 39, and the second contact electrode 720 may be spaced from the first contact electrode 710 by the second insulating layer 520. Thus, the first and second contact electrodes 710 and 720 may be insulated from each other.

Figure 21:
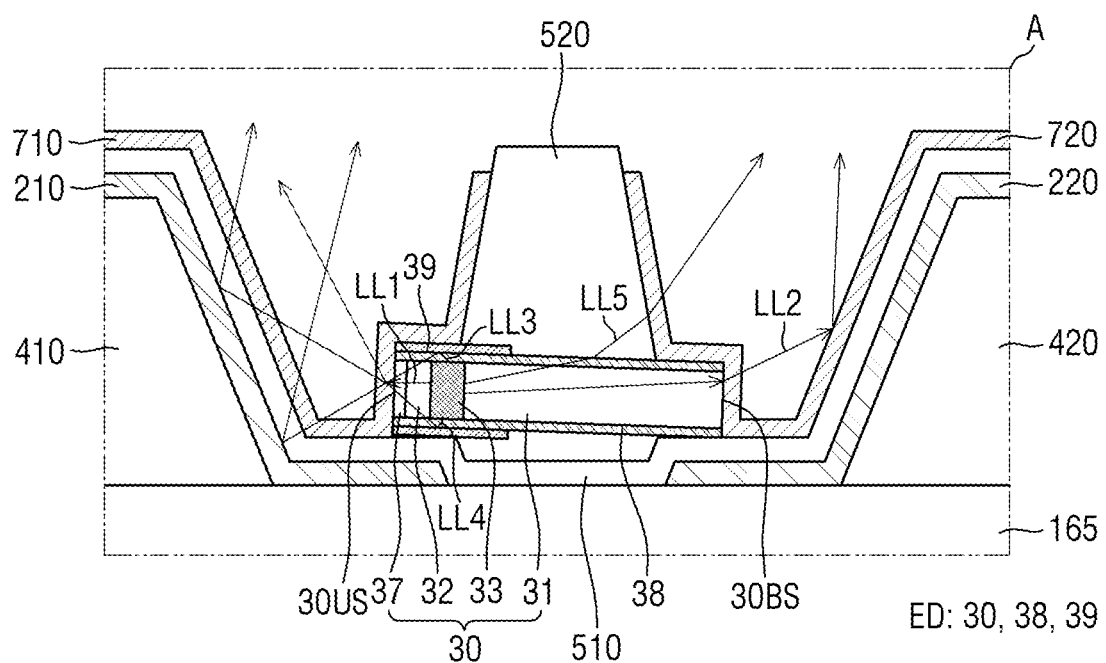
FIG. 21 is a schematic enlarged cross-sectional view illustrating the traveling direction of light emitted from the light-emitting element of FIG. 20.

FIG. 21 is a schematic enlarged cross-sectional view illustrating the traveling direction of light emitted from the light-emitting element of FIG. 20.

Referring to FIG. 21, light generated by the device active layer 33 may travel in random directions without any particular directivity. For example, among beams of light generated by the device active layer 33, light LL1 may be emitted through a first end surface of the light-emitting element core 30, i.e., a first surface 30US. Then, the light LL1 may be reflected by the top surface of the first electrode 210 on the side surface of the first sub-bank 410 and may thus travel in the display direction of the display device 10. Among the beams of light generated by the device active layer 33, light LL2 may be emitted through a second end surface of the light-emitting element core 30, i.e., a second surface 30BS. Then, the light LL2 may be reflected by the top surface of the second electrode 220 on the side surface of the second sub-bank 420 and may thus travel in the display direction of the display device 10. Among beams of light emitted through the lateral surface of the light-emitting element core 30, light LL3 and light LL4 may travel toward the inner lateral surface of the reflective film 39 through the device insulating film 38. The light LL3 that travels upwardly toward the reflective film 39 and the light LL4 that travels downwardly toward the reflective film 39 may be reflected by the inner lateral surface of the reflective film 39 to travel toward an inner side of the light-emitting element core 30 and may then be emitted through the first surface 30US of the light-emitting element core 30. Among the beams of light emitted through the lateral surface of the light-emitting element core 30, light LL5 may be emitted through part of the device insulating film 38 where the reflective film 39 is not formed.

According to the embodiments of FIGS. 20 and 21, as the light-emitting element ED includes the light-emitting element core 30 and the reflective film 39, which surrounds the lateral surface of the light-emitting element core 30, light generated by the device active layer 33 of the light-emitting element core 30 can be induced to be emitted through both end surfaces of the light-emitting element core 30. Thus, light emitted by the light-emitting element ED can be induced to travel toward the first and second electrodes 210 and 220, which include a reflective material. Accordingly, the emission efficiency of the display device 10 can be improved.

Figure 22:
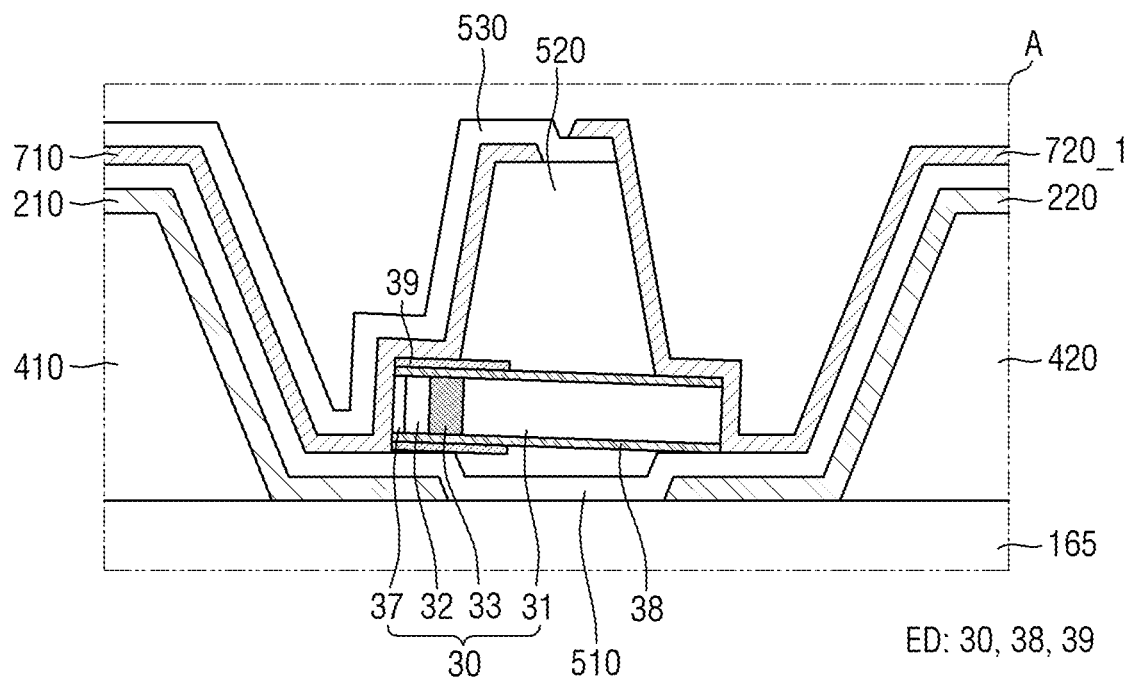
FIG. 22 is a schematic enlarged cross-sectional view of another area A of FIG. 3.

FIG. 22 is a schematic enlarged cross-sectional view of another example of area A of FIG. 3.

The embodiment of FIG. 22 differs from the embodiment of FIG. 20 at least in that the display device 10 further includes a third insulating layer 530.

Referring to FIG. 22, the third insulating layer 530 may be disposed on the first contact electrode 710 and the second insulating layer 520. The third insulating layer 530 may be disposed on the first contact electrode 710 and may thus cover (or overlap) the first contact electrode 710. The third insulating layer 530 may be disposed on the second insulating layer 520, but may expose the second end portion of the light-emitting element ED. Side surfaces of the second and third insulating layers 520 and 530 may be aligned with each other.

A second contact electrode 720_1 may be disposed on the third insulating layer 530. The first and second contact electrodes 710 and 720_1 may be insulated from each other by the third insulating layer 530. For example, the third insulating layer 530 may be interposed between the first and second contact electrodes 710 and 720_1 to insulate the first and second contact electrodes 710 and 720_1 from each other.

Figure 23:
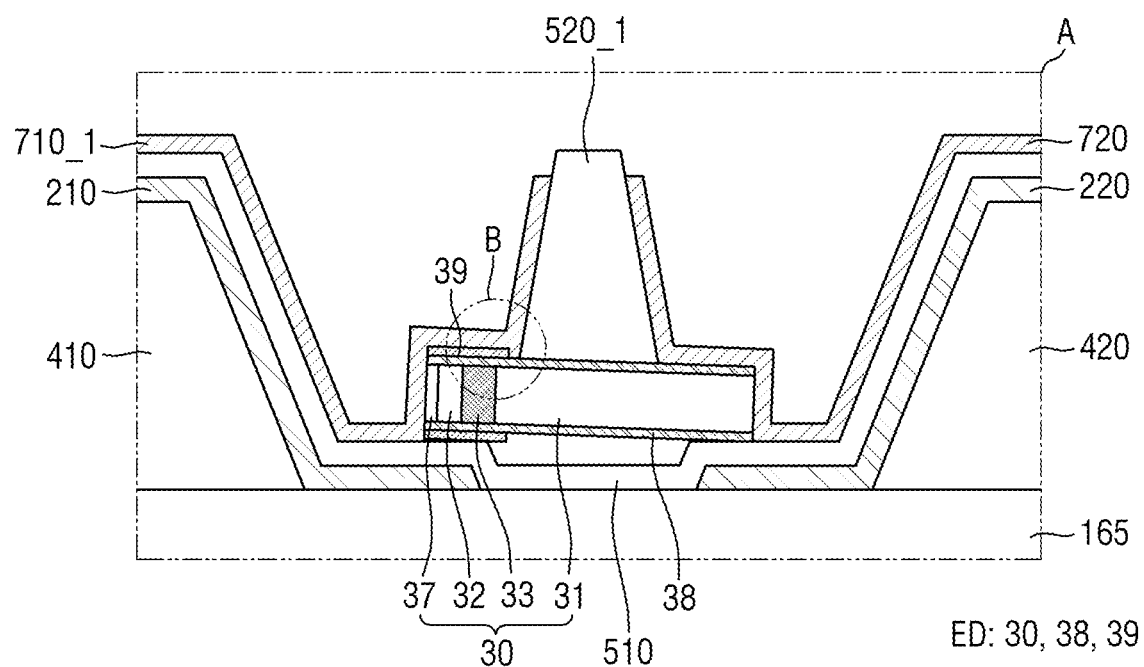
FIG. 23 is a schematic enlarged cross-sectional view of another area A of FIG. 3.
Figure 24:
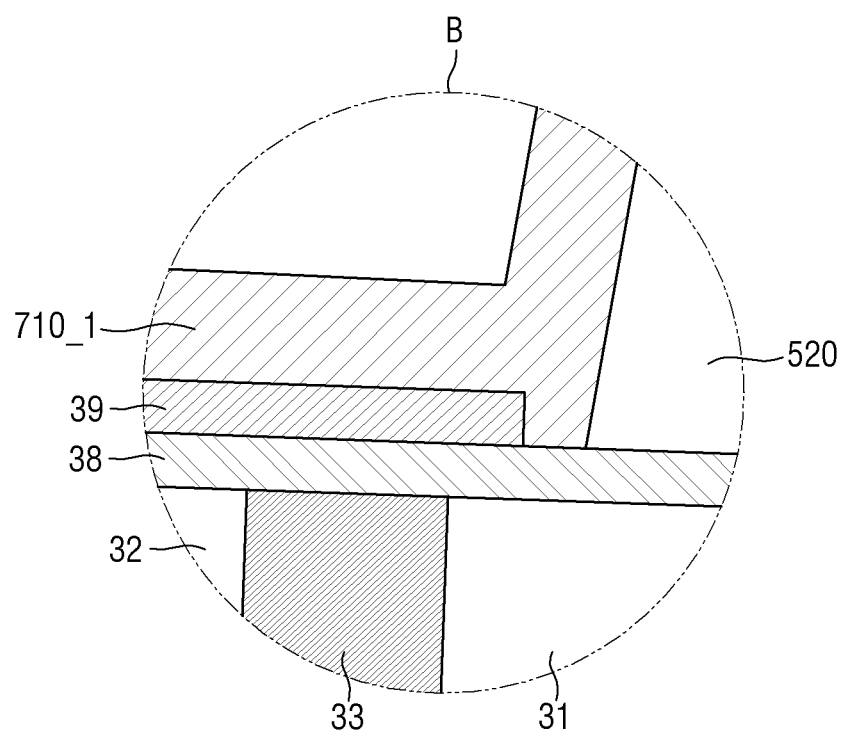
FIG. 24 is a schematic enlarged cross-sectional view of an area B of FIG. 23.

FIG. 23 is a schematic enlarged cross-sectional view of another example of area A of FIG. 3. FIG. 24 is a schematic enlarged cross-sectional view of area B of FIG. 23.

The embodiments of FIGS. 23 and 24 differs from the embodiment of FIG. 20 at least in that a second insulating layer 520_1 does not overlap the reflective film 39 of the light-emitting element ED in the third direction DR3.

Referring to FIGS. 23 and 24, the second insulating layer 520_1 may be formed on the light-emitting element ED not to overlap the reflective film 39 of the light-emitting element ED. Thus, the second insulating layer 520_1 may be disposed on the outer lateral surface of part of the device insulating film 38 exposed by the reflective film 39, but not on the outer lateral surface of the reflective film 39. Thus, the exposed part of the device insulating film 38 in the gap between the second insulating layer 520_1 and the reflective film 39 may contact a first contact electrode 710_1.

Figure 25:
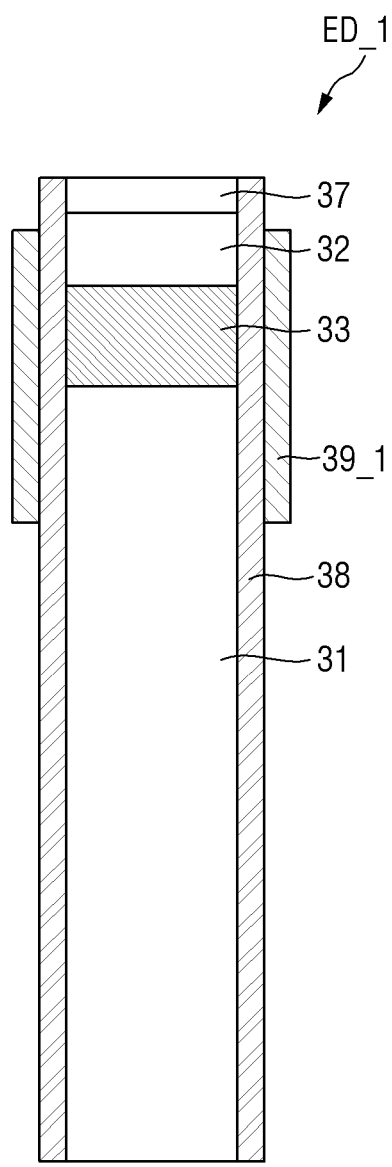
FIG. 25 is a schematic cross-sectional view of a light-emitting element according to another embodiment of the disclosure.

FIG. 25 is a schematic cross-sectional view of a light-emitting element according to an embodiment.

A light-emitting element ED_1 of FIG. 25 differs from the light-emitting element ED of FIG. 6 at least in that a reflective film 39_1 is not disposed on a device insulating film 38 surrounding a device electrode layer 37.

Specifically, the reflective film 39_1 may not be disposed on the lateral surface of the device electrode layer 37. Therefore, the reflective film 39_1 may expose part of the device insulating film 38 disposed on a first end portion of the light-emitting element ED_1. For example, the reflective film 39_1 may be disposed to expose both end portions of a light-emitting element core 30.

The light-emitting element ED_1 may be formed in the process of etching a reflective material layer 3900 (see FIG. 17) to form the reflective film 39_1. Specifically, during the formation of the reflective film 39_1, the reflective material layer 3900 may be over-etched so that the reflective film 39_1, which exposes the part of the device insulating film 38 disposed on the first end portion of the light-emitting element ED_1, may be obtained.

Even though the reflective film 39_1 is disposed on the device insulating film 38 to expose both end portions of the light-emitting element core 30, the reflective film 39_1 may be formed to surround the lateral surface of a device active layer 33. Thus, light generated by the device active layer 33 and emitted through the lateral surface of the device active layer 33 may be reflected by the reflective film 39_1 and may thus be induced to be emitted through both end surfaces of the light-emitting element core 30. Accordingly, the amount of light emitted through both the end surfaces of the light-emitting element ED_1 can be increased.

Figure 26:
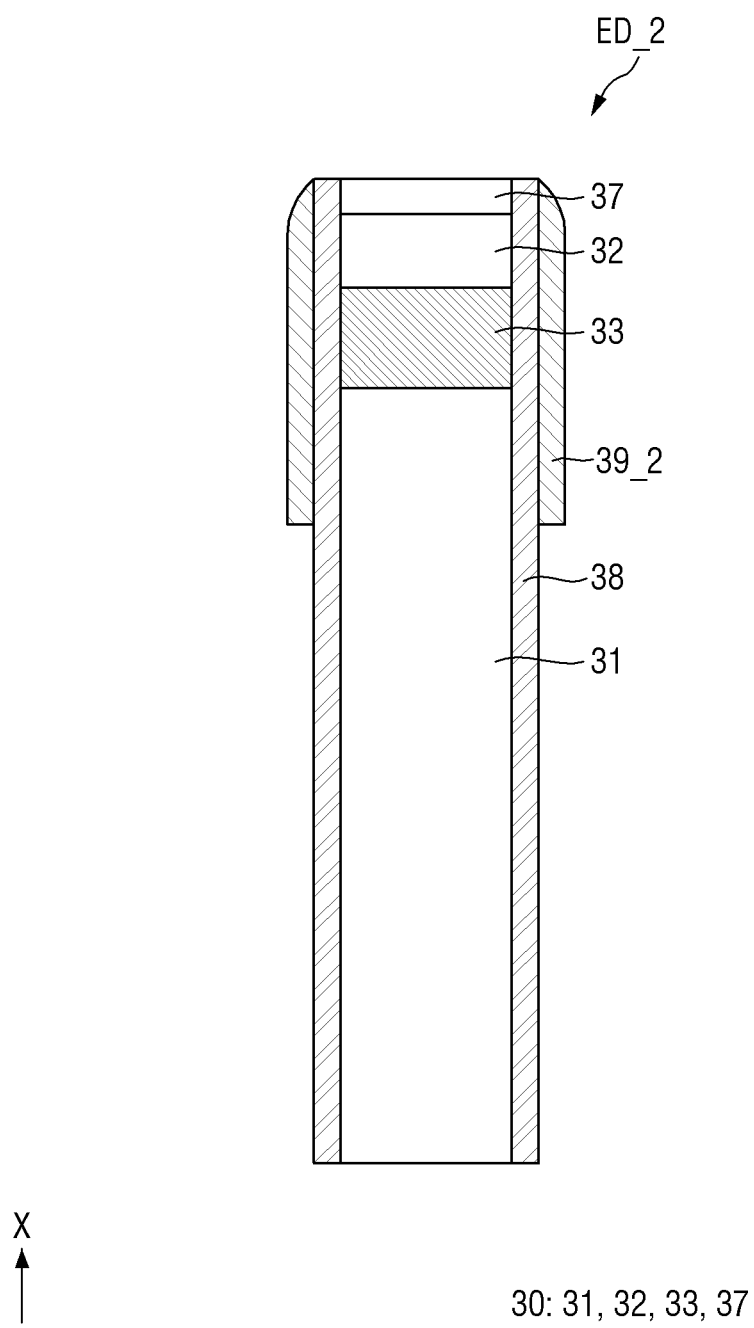
FIG. 26 is a schematic cross-sectional view of a light-emitting element according to another embodiment of the disclosure.

FIG. 26 is a schematic cross-sectional view of a light-emitting element according to an embodiment.

A light-emitting element ED_2 of FIG. 26 differs from the light-emitting element ED of FIG. 6 at least in that the top surface of a reflective film 39_2 is curved.

Referring to FIG. 26, the outer surfaces of part of the reflective film 39_2 that surrounds a device electrode layer 37 may be curved. Top surfaces of reflective film 39_2 may be inclined in part. The reflective film 39_2 may be formed by etching a reflective material layer 3900 (see FIG. 17). For example, not only the top surfaces, but also the side surfaces of the reflective material layer 3900 may be removed so that the light-emitting element ED_2, which includes the reflective film 39_2 having a partially-curved top surface, may be obtained.

Figure 27:
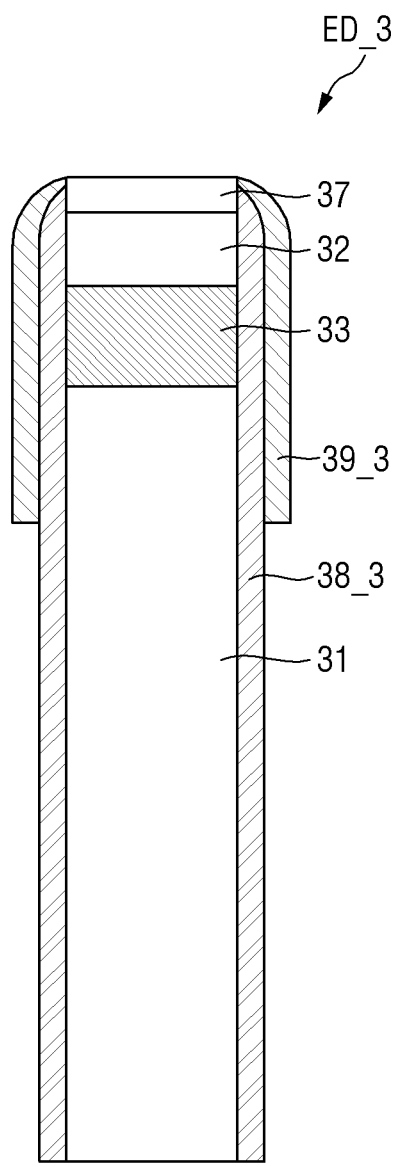
FIG. 27 is a schematic cross-sectional view of a light-emitting element according to another embodiment of the disclosure.

FIG. 27 is a schematic cross-sectional view of a light-emitting element according to an embodiment.

A light-emitting element ED_3 of FIG. 27 differs from the light-emitting element ED of FIG. 6 at least in that a device insulating film 38_3 exposes part of the lateral surface of a device electrode layer 37 and a reflective film 39_3 contacts the exposed part of the lateral surface of the device electrode layer 37.

Referring to FIG. 27, the device insulating film 38_3 may expose part of the lateral surface of the device electrode layer 37. During the formation of the device insulating film 38_3, a device insulating film material layer 3800 (see FIG. 11) may be over-etched so that the device insulating film 38_3 may expose part of the lateral surface of the device electrode layer 37. Thus, the reflective film 39_3, which is formed on a light-emitting element core 30 and the device insulating film 38_3, may contact the lateral surface of the exposed part of the lateral surface of the device electrode layer 37.

Figure 28:
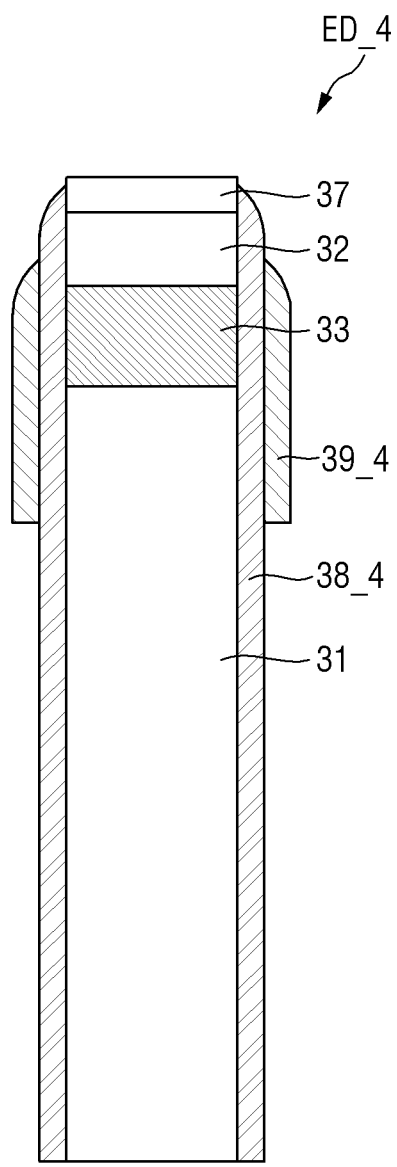
FIG. 28 is a schematic cross-sectional view of a light-emitting element according to another embodiment of the disclosure.

FIG. 28 is a schematic cross-sectional view of a light-emitting element according to an embodiment.

A light-emitting element ED_4 of FIG. 28 differs from the light-emitting element ED of FIG. 6 at least in that a device insulating film 38_4 exposes part of the lateral surface of a device electrode layer 37 and a side surface of a reflective film 39_4 is not aligned with a side surface of the exposed part of the device electrode layer 37.

Referring to FIG. 28, the reflective film 39_4 may not be disposed on the lateral surface of the device electrode layer 38. The device insulating film 38_4 and the reflective film 39_4 may not be disposed on the lateral surface of the device electrode layer 37. Thus, the device electrode layer 37 may be exposed.

Figure 29:
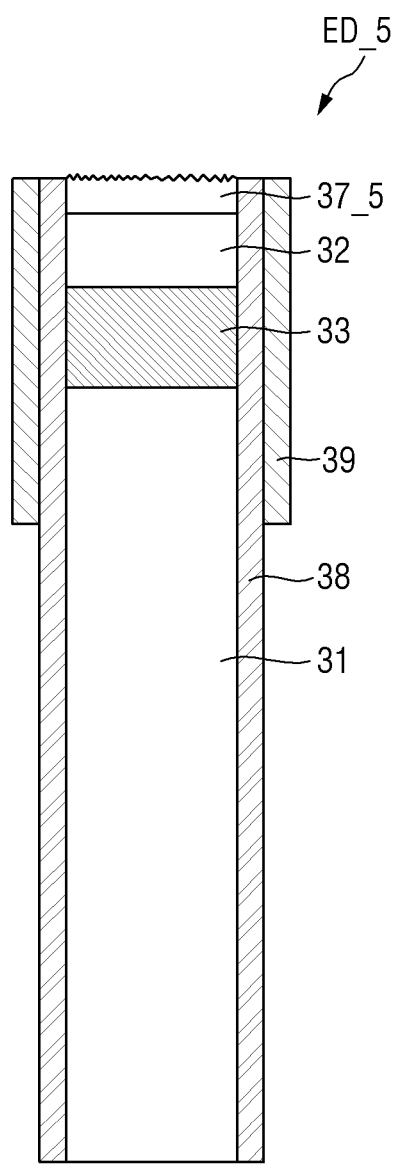
FIG. 29 is a schematic cross-sectional view of a light-emitting element according to another embodiment of the disclosure.

FIG. 29 is a schematic cross-sectional view of a light-emitting element according to an embodiment.

A light-emitting element ED_5 of FIG. 29 differs from the light-emitting element ED of FIG. 6 at least in that surface unevenness is formed on the top surface of a device electrode layer 37_5.

Referring to FIG. 29, as the top surface of the device electrode layer 37_5 is exposed to an etchant during a full-surface etching process for forming a device insulating film 38 and a reflective film 39, surface unevenness may be formed on the top surface of the device electrode layer 37_5.

Figure 30:
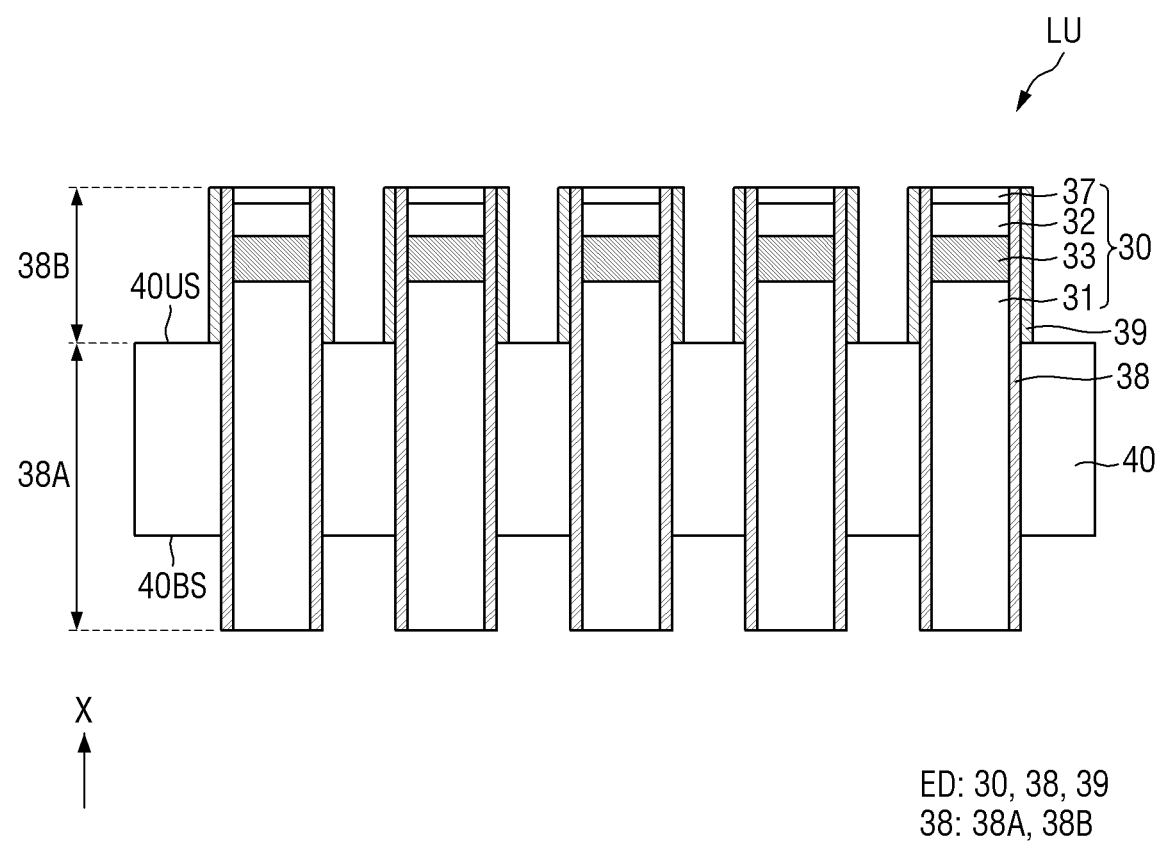
FIG. 30 is a schematic cross-sectional view of a light-emitting element unit according to an embodiment of the disclosure.

FIG. 30 is a schematic cross-sectional view of a light-emitting element unit according to an embodiment.

Referring to FIG. 30, a light-emitting element unit LU includes light-emitting elements ED and a binder 40. The light-emitting elements ED may extend in a direction X, and the binder 40 may be formed to surround and affix parts of the light-emitting elements ED.

The shape and structure of the light-emitting elements ED may be substantially identical or similar to those described above, and thus, detailed descriptions thereof will be omitted.

The light-emitting elements ED may be arranged to be a predetermined distance apart from one another. The light-emitting elements ED may be spaced apart from each other in a direction perpendicular to the length direction of the light-emitting elements ED, i.e., in a direction perpendicular to the direction X. The light-emitting elements ED may be spaced apart from, and face, one another with the binder 40 interposed therebetween. The lateral surfaces of each pair of adjacent light-emitting elements ED may be spaced apart from, and face, each other. The light-emitting elements ED may be arranged in a matrix, but the disclosure is not limited thereto.

The stacking directions of semiconductor layers included in each of the light-emitting elements ED may be identical to each other. For example, the light-emitting elements ED may be arranged so that a first semiconductor layer 31 may be disposed below a device active layer 33, and a second semiconductor layer 32 may be disposed above the device active layer 33.

The binder 40 may be formed so that the light-emitting elements ED may be located in the binder 40. The light-emitting elements ED may penetrate the binder 40 in the direction X.

The binder 40 may be formed to surround parts of the lateral surfaces of the light-emitting elements ED. The binder 40 may be formed to expose both end portions of each of the light-emitting elements ED. For example, the light-emitting elements ED may penetrate the binder 40 in the direction X so that both end portions of each of the light-emitting elements ED, i.e., upper and lower end portions of each of the light-emitting elements ED, may protrude from the binder 40 in the direction X.

The binder 40 may be disposed to surround parts of the outer lateral surfaces of device insulating films 38 of the light-emitting elements ED. The binder 40 may overlap reflective films 39 of the light-emitting elements ED in the direction X but may not overlap light-emitting element cores 30 and the device insulating films 38 of the light-emitting elements ED.

As already described above, the device insulating films 38 may include first areas 38B, which are surrounded by the reflective films 39, and second areas 38A, which are exposed by the reflective films 39, and the binder 40 may be disposed to surround the second areas 38A of the device insulating films 38. The binder 40 may be disposed on parts of the second areas 38A of the device insulating films 38 to expose end portions of the light-emitting elements ED. The binder 40 may not overlap the first areas 38B of the device insulating films 38 in the direction perpendicular to the direction X. Thus, the binder 40 may overlap the reflective films 39 in the direction X, but not in the direction perpendicular to the direction X.

As the binder 40 is formed not to overlap the reflective films 39 in the direction perpendicular to the direction X, the binder 40 may be disposed on the lateral surfaces of first semiconductor layers 31, but not on the lateral surfaces of second semiconductor layers 32 and device active layers 33. Thus, the binder 40 may surround parts of the lateral surfaces of the first semiconductor layers 31, but may not surround the second semiconductor layers 32 and the device active layers 33.

The binder 40 may include a first surface 40US and a second surface 40BS. The first surface 40US may be the top surface of the binder 40, and the second surface 40BS may be the bottom surface of the binder 40. The first surface 40US may be a surface of the binder 40 that faces the device active layers 33, and the second surface 40BS may be a surface of the binder 40 that faces the first semiconductor layers 31.

The reflective films 39 may be disposed above the binder 40 to surround parts of the outer lateral surfaces of the device insulating films 38 exposed by the binder 40. The reflective films 39 may be disposed on first end portions of the light-emitting element cores 30, but not on second end portions of the light-emitting element cores 30, with respect to the binder 40. The first end portions of the light-emitting element cores 30 where the reflective films 39 are disposed may be end portions of the light-emitting element cores 30 where the device active layers 33 and the second semiconductor layers 32 are disposed. The reflective films 39 may be disposed on the top surface 40US of the binder 40. The bottom surfaces of the reflective films 39 may contact the top surface 40US of the binder 40. The locations of the reflective films 39 and the binder 40 and the contact relationship therebetween may be determined by a process of fabricating the light-emitting element unit LU.

As the light-emitting elements ED are affix by the binder 40, a field applying process for aligning the light-emitting elements ED to be oriented in a particular direction and an inkjet printing process can be omitted from a process of disposing the light-emitting elements ED on a substrate SUB during the manufacture of the display device 10. As the number of light-emitting elements ED included in the light-emitting element unit LU can be controlled by adjusting the shape and area of the binder 40, the uniformity of the luminance of each pixel PX of the display device 10 can be improved. Accordingly, the display quality of the display device 10 can be improved.

Figure 31:
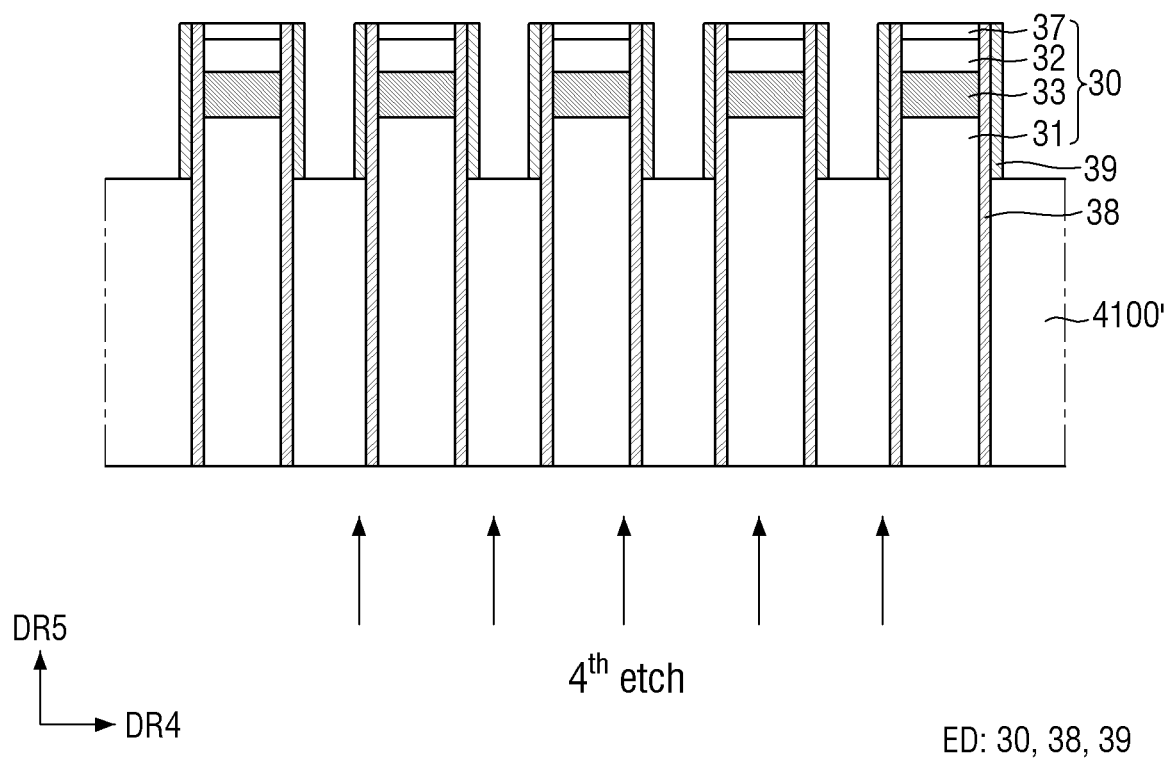
FIG. 31 is a schematic cross-sectional view illustrating a method of fabricating a light-emitting element unit according to an embodiment of the disclosure.

FIG. 31 is a schematic cross-sectional view illustrating a method of fabricating a light-emitting element unit according to an embodiment. FIG. 31 may be a schematic cross-sectional view illustrating how to fabricate the light-emitting element unit LU after the process illustrated in FIG. 18.

Referring to FIGS. 18 and 31, the light-emitting element unit LU is formed by performing a fourth etch process that removes parts of the second binder material layer 4100'.

Specifically, the fourth etch process may etch the second binder material layer 4100' from below the second binder material layer 4100' in the fifth direction DR5. The fourth etch process may be performed on the entire surface of the second binder material layer 4100'. As a result of the fourth etch process, the second end portions of the light-emitting element cores 30 may be exposed, and the light-emitting element unit LU of FIG. 30 may be obtained.

Figure 32:
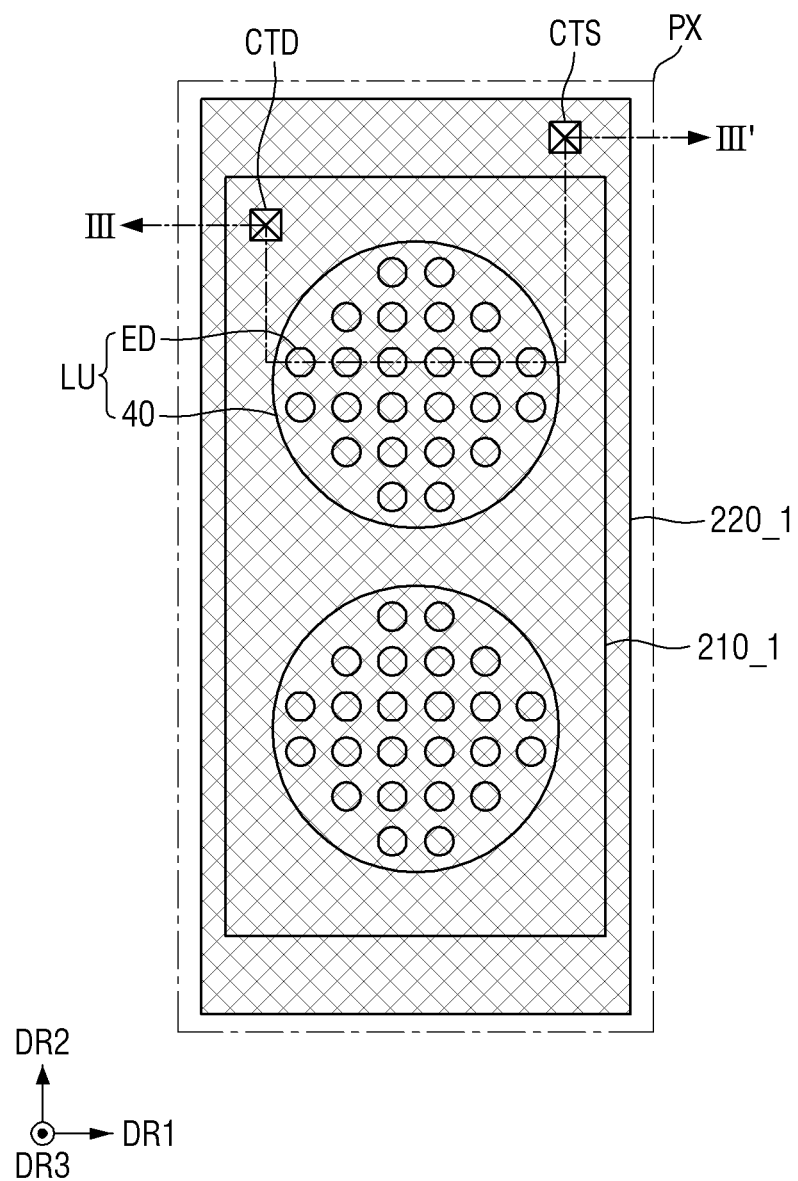
FIG. 32 is a schematic plan view of a pixel of a display device according to another embodiment of the disclosure.
Figure 33:
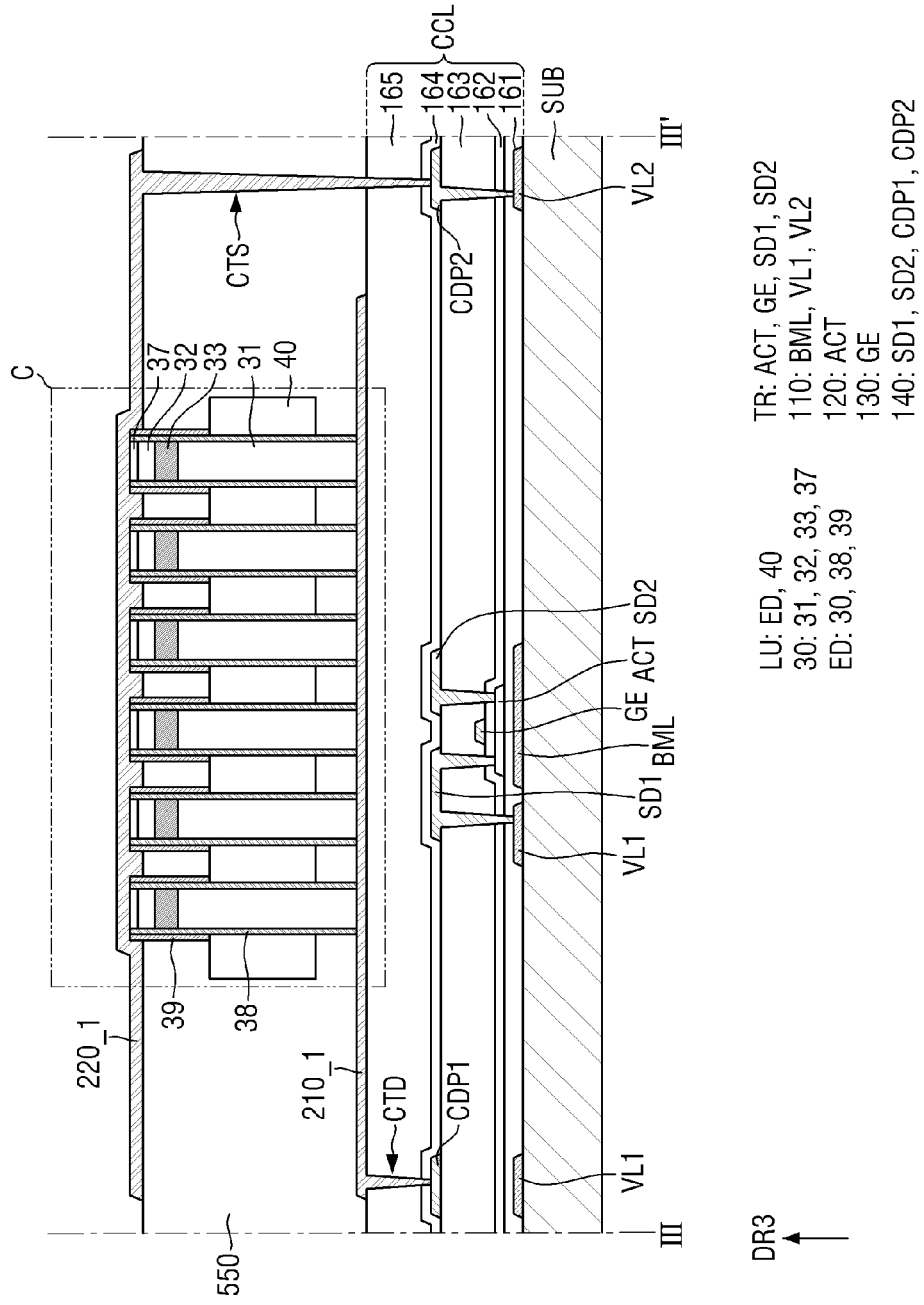
FIG. 33 is a schematic cross-sectional view taken along line III-III' of FIG. 32.
Figure 34:
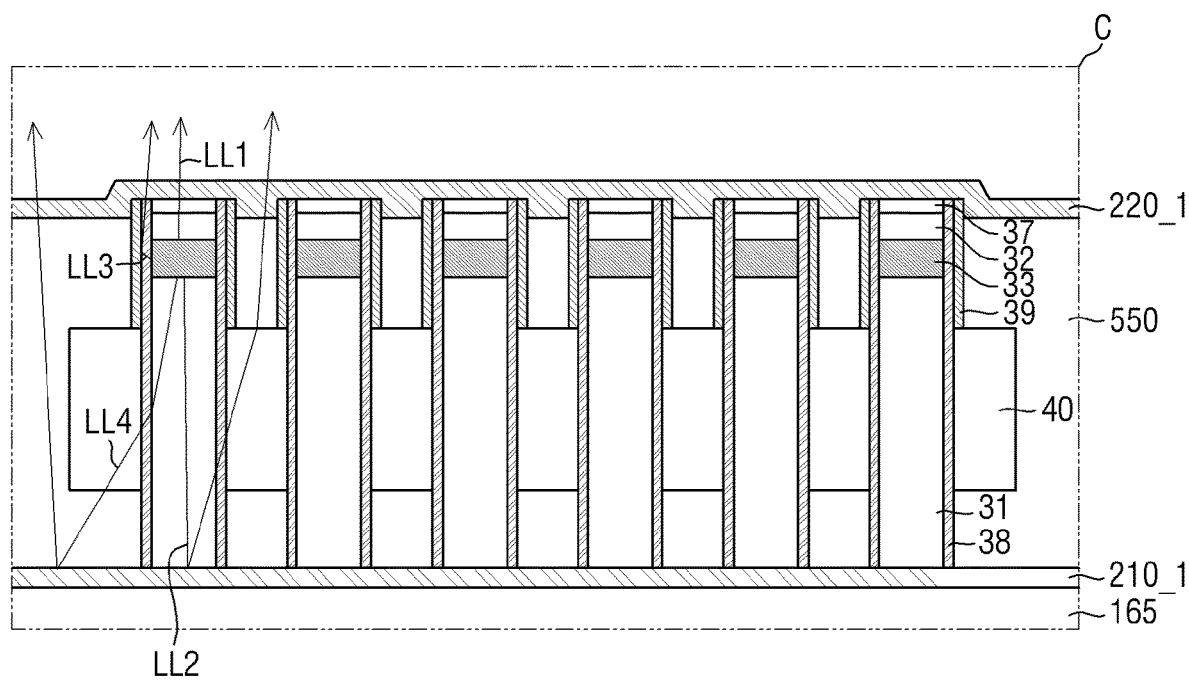
FIG. 34 is a schematic enlarged cross-sectional view of an area C of FIG. 33.

FIG. 32 is a schematic plan view of a pixel of a display device according to an embodiment. FIG. 33 is a schematic cross-sectional view taken along line III-III' of FIG. 32. FIG. 34 is a schematic enlarged cross-sectional view of area C of FIG. 33.

Referring to FIGS. 32 to 34, a pixel PX may include a first electrode 210_1, a second electrode 220_1, and light-emitting element units LU. FIG. 32 illustrates that the pixel PX includes two light-emitting element units LU, but the disclosure is not limited thereto. As another example, only a light-emitting element unit LU or three or more light-emitting element units LU may be disposed in the pixel PX depending on the size of the pixel PX and the size of the light-emitting element units LU.

The first electrode 210_1 may be patterned and may be disposed in the pixel PX. The first electrode 210_1 may have a rectangular shape including first and second sides that extend in first and second directions DR1 and DR2, respectively, in a plan view. The first electrode 210_1 may be arranged in an island pattern. The first electrode 210_1 may be a surface electrode.

The first electrode 210_1 may be disposed on a circuit element layer CCL. Specifically, the first electrode 210_1 may be disposed directly on a via layer 165 of the circuit element layer CCL. The first electrode 210_1 may completely cover (or overlap) the light-emitting element units LU from below the light-emitting element units LU.

The first electrode 210_1 may be electrically connected to a first conductive pattern CDP1, which is disposed below the first electrode 210_1, through a first electrode contact hole CTD, which penetrates the via layer 165 and a passivation layer 164. Specifically, the first electrode 210_1 may contact part of the first conductive pattern CDP1 exposed by the first electrode contact hole CTD. The first electrode 210_1 may receive a first power supply voltage applied via a first voltage line VL1, through the first conductive pattern CDP1.

The second electrode 220_1 may be disposed on the first electrode 210_1 to correspond to the pixel PX. In an embodiment, the second electrode 220_1 may be patterned and may be disposed in the pixel PX. The second electrode 220_1 may have a rectangular shape including first and second sides that extend in the first and second directions DR1 and DR2, respectively, in a plan view. The second electrode 220_1, similar to the first electrode 210_1, may be arranged in an island pattern, over the entire surface of a display device 10, but the disclosure is not limited thereto. As another example, the second electrode 220_1 may be disposed in and across two or more pixels PX to form a single plane over the entire surface of a display area DPA.

The second electrode 220_1 may overlap the first electrode 210_1 in a third direction DR3. At least part of the second electrode 220_1 may overlap the first electrode 210_1 in the third direction DR3. The first and second electrodes 210_1 and 220_1 may have different widths or areas. In an embodiment, the second electrode 220_1 may be formed to have a larger area than the first electrode 210_1.

The second electrode 220_1 may be electrically connected to a second conductive pattern CDP2, which is disposed below the second electrode 220_1, through a second electrode contact hole CTS, which penetrates a fourth insulating layer 550, the via layer 165, and the passivation layer 164. Specifically, the second electrode 220_1 may contact part of the second conductive pattern CDP2 exposed by the second electrode contact hole CTS. The second electrode 220_1 may receive a second power supply voltage applied via a second voltage line VL2, through the second conductive pattern CDP2.

The light-emitting element units LU may be disposed between the first and second electrodes 210_1 and 220_1. The light-emitting element units LU may be disposed between the first and second electrodes 210_1 and 220_1 to overlap the first and second electrodes 210_1 and 220_1 in the third direction DR3. The light-emitting element units LU may be disposed on the first electrode 210_1. The light-emitting element units LU may be disposed so that a direction in which light-emitting elements ED extend may be perpendicular to a surface of a substrate SUB. For example, the light-emitting element units LU may be disposed between the first and second electrodes 210_1 and 220_1 so that the direction in which the light-emitting elements ED extend may correspond to the third direction DR3.

First end portions of light-emitting elements ED included in each of the light-emitting element units LU may face downward, and second end portions of the light-emitting elements ED may face upward. The first end portions of the light-emitting elements ED may be end portions of the light-emitting elements ED where first semiconductor layers 31 are disposed, and the second end portions of the light-emitting elements ED may be end portions of the light-emitting elements ED where second semiconductor layers 32 are disposed. For example, the first end portions of the light-emitting elements ED may be end portions of the light-emitting elements ED not surrounded by reflective films 39, and the second end portions of the light-emitting elements ED may be end portions of the light-emitting elements ED surrounded by the reflective films 39. The first end portions of the light-emitting elements ED may also be referred to as lower end portions, and the second end portions of the light-emitting elements ED may also be referred to as upper end portions.

The lower end portions of the light-emitting elements ED may contact the top surface of the first electrode 210_1. As the lower end portions of the light-emitting elements ED contact the top surface of the first electrode 210_1, the light-emitting elements ED and the first electrode 210_1 may be electrically connected.

The fourth insulating layer 550 may be disposed on the first electrode 210_1 and the light-emitting element units LU to cover (or overlap) the light-emitting element units LU on the first electrode 210_1. The fourth insulating layer 550 may be formed to be lower than the top surfaces of the light-emitting elements ED from the circuit element layer so that the upper end portions of the light-emitting elements ED may be exposed. The fourth insulating layer 550 may completely cover the lower end portions of the light-emitting elements ED and may expose the upper end portions of the light-emitting elements ED. Thus, the upper end portions of the light-emitting elements ED may protrude beyond the top surface of the fourth insulating layer 550 so that the outer surfaces of each of the upper end portions of the light-emitting elements ED may directly contact the fourth insulating layer 550. The outer surfaces of each of the protruding end portions of the light-emitting elements ED may contact the second electrode 220_1, which is disposed on the fourth insulating layer 550. For example, the thickness of the fourth insulating layer 550 may be smaller than the sum of the thickness of the first electrode 210_1 and the length of light-emitting element cores 30. The fourth insulating layer 550 may include an inorganic insulating material or an organic insulating material.

The second electrode 220_1 may be disposed on the fourth insulating layer 550 and may contact the upper end portions of the light-emitting elements ED that protrude beyond the top surface of the fourth insulating layer 550. The second electrode 220_1 may be disposed to surround the upper end portions of the light-emitting elements ED. Specifically, the second electrode 220_1 may contact the top surfaces of device electrode layers 37 of the light-emitting element cores 30 and the lateral surfaces of the reflective films 39. The first electrode 210_1 may contact the lower end portions of the light-emitting elements ED, and the second electrode 220_1 may contact the upper end portions of the light-emitting elements ED.

In an embodiment, the first electrode 210_1 may be a pixel electrode separate for each individual pixel PX, and the second electrode 220_1 may be a common electrode that is electrically connected throughout all pixels PX. However, the disclosure is not limited thereto. In another example, the first electrode 210_1 may be a common electrode that is electrically connected throughout all pixels PX, and the second electrode 220_1 may be a pixel electrode separate for each individual pixel PX.

The first electrode 210_1 may include a conductive material with high reflectance, and the second electrode 220_1 may include a transparent conductive material. As already mentioned above, the light-emitting elements ED emit light in the directions of both end portions thereof, particularly, in the third direction DR3 that is faced by the top surface of the first electrode 210_1. In some embodiments, as the first electrode 210_1 includes a conductive material with high reflectance, light emitted from the light-emitting elements ED to travel toward the top surface of the first electrode 210_1 may be reflected by the first electrode 210_1. Some of light emitted from the light-emitting elements ED may be emitted in the display direction of the display device 10 through the second electrode 220_1, and another part of the light emitted from the light-emitting elements ED may be reflected from the top surface of the first electrode 210_1, which includes a material with high reflectance, and may be emitted in the display direction of the display device 10. In an embodiment, the first electrode 210_1 may include a metal with high reflectance such as Ag, Cu, or Al, and the second electrode 220_1 may include a transparent conductive material such as ITO, IZO, or ITZO.

Referring to FIG. 34, among beams of light emitted through the top surfaces of device active layers 33, light LL1 may be emitted in the display direction of the display device 10 through the top surfaces of the light-emitting elements ED and may thus pass through the second electrode 220_1. Among beams of light emitted through the bottom surfaces of the device active layers 33, light LL2 may be emitted through the bottom surfaces of the light-emitting elements ED and reflected from the top surface of the first electrode 210_1. The light LL2 may be emitted in the display direction of the display device 10 and thus may pass through the second electrode 220_1. Among beams of light emitted through the lateral surfaces of the device active layers 33, light LL3 may pass through parts of the device insulating films 38 surrounded by the reflective films 39 and may thus be reflected from the inner lateral surfaces of the reflective films 39. The light LL3 may be emitted in the display direction of the display device 10 through the top surfaces of the light-emitting elements ED and may thus pass through the second electrode 220_1. Among beams of the light emitted through the lateral surfaces of the device active layers 33, light LL4 may pass through parts of the device insulating films 38 exposed by the reflective films 39 and may travel toward a binder 40. Then, the light LL4 may be reflected from the top surface of the first electrode 210_1, may be emitted in the display direction of the display device 10, and may thus pass through the second electrode 220_1.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A light-emitting element comprising:
a light-emitting element core extending in a first direction, the light-emitting element core including:
a first semiconductor layer;
a second semiconductor layer disposed on the first semiconductor layer along the first direction; and
a device active layer disposed between the first semiconductor layer and the second semiconductor layer along the first direction;
a device insulating film surrounding a lateral surface of the light-emitting element core; and
a reflective film disposed on an outer lateral surface of the device insulating film and surrounding at least a lateral surface of the device active layer, wherein
the device insulating film includes an inner lateral surface facing the lateral surface of the light-emitting element core along a second direction perpendicular to the first direction and the outer lateral surface opposite to the inner lateral surface along the second direction, and
the reflective film exposes a part of the outer lateral surface of the device insulating film.

2. The light-emitting element of claim 1, wherein the first semiconductor layer, the device active layer, and the second semiconductor layer are sequentially disposed in the first direction, and a length of the reflective film in the first direction is shorter than a length of the light-emitting element core in the first direction.

3. The light-emitting element of claim 2, wherein the length of the reflective film in the first direction is greater than a thickness of the device active layer.

4. The light-emitting element of claim 3, wherein the reflective film extends in the first direction on the lateral surface of the device active layer and is disposed even on a lateral surface of the first semiconductor layer or a lateral surface of the second semiconductor layer.

5. The light-emitting element of claim 4, wherein
a thickness of the first semiconductor layer in the first direction is greater than a thickness of the second semiconductor layer in the first direction,
the lateral surface of the first semiconductor layer includes:
a first area surrounded by the reflective film; and
a second area exposed by the reflective film, and
a length of the first area in the first direction is shorter than a length of the second area in the first direction.

6. The light-emitting element of claim 2, wherein
the device active layer includes:
a first surface facing a first end surface of the light-emitting element core; and
a second surface facing a second end surface of the light-emitting element core,
the first end surface of the light-emitting element core is a surface on a side of the light-emitting element core in the direction,
the second end surface of the light-emitting element core is a surface on another side of the light-emitting element core in the direction, and
a distance between the first end surface of the light-emitting element core and the first surface of the device active layer is smaller than a distance between the second end surface of the light-emitting element core and the second surface of the device active layer.

7. A light-emitting element unit comprising:
a plurality of light-emitting elements extending in a first direction, the plurality of light-emitting elements being aligned with and spaced apart from one another in a second direction that is perpendicular to the first direction; and
a binder surrounding the plurality of light-emitting elements and affixing the plurality of light-emitting elements,
wherein each of the plurality of light-emitting elements includes:
a light-emitting element core including:
a first semiconductor layer;
a second semiconductor layer disposed on the first semiconductor layer along the first direction; and
a device active layer disposed between the first semiconductor layer and the second semiconductor layer along the first direction;
a device insulating film surrounding a lateral surface of the light-emitting element core; and
a reflective film disposed on an outer lateral surface of the device insulating film and surrounding at least a lateral surface of the device active layer,
wherein the device insulating film includes an inner lateral surface facing the lateral surface of the light-emitting element core along a second direction perpendicular to the first direction and the outer lateral surface opposite to the inner lateral surface along the second direction.

8. The light-emitting element unit of claim 7, wherein the reflective film completely overlaps the lateral surface of the device active layer.

9. The light-emitting element unit of claim 8, wherein
the first semiconductor layer, the device active layer, and the second semiconductor layer are sequentially disposed in the first direction, and
a length of the reflective film in the first direction is shorter than a length of the light-emitting element core in the first direction.

10. The light-emitting element unit of claim 9, wherein the length of the reflective film in the first direction is greater than a thickness of the device active layer in the first direction.

11. The light-emitting element unit of claim 9, wherein a thickness of the binder in the first direction is smaller than the length of the light-emitting element core in the first direction.

12. The light-emitting element unit of claim 7, wherein the device insulating film includes:
a first area surrounded by the reflective film; and
a second area exposed by the reflective film, and
the binder is disposed on the second area of the device insulating film and is not disposed on the first area of the device insulating film.

13. The light-emitting element unit of claim 12, wherein the binder surrounds the first semiconductor layer and does not surround the second semiconductor layer or the device active layer.

14. The light-emitting element unit of claim 13, wherein the reflective film contacts a surface of the binder facing the device active layer.

15. The light-emitting element unit of claim 7, wherein
the binder exposes end portions of the light-emitting element core, and
the reflective film is disposed on an end portion of the light-emitting element core but is not disposed on another end portion of the light-emitting element core.

16. The light-emitting element of claim 1, wherein
the light-emitting element core further comprises:
a first end surface; and
a second end surface opposite the first end surface and spaced apart from the first end surface by a length of the light-emitting element core in the first direction, and the lateral surface extending from the first end surface to the second end surface.

17. The light-emitting element of claim 16, wherein the device insulating film covers an entirety of the lateral surface.

18. The light-emitting element of claim 16, wherein light produced in the device active layer emerges from the light-emitting element through each of the first end surface, the second end surface and portions of the lateral surface.

19. The light-emitting element of claim 1, wherein the reflective film is comprised of a material selected from Al, Ni, Ag, La, and $BaSO_x$.

20. The light-emitting element of claim 18, wherein
the light-emitting element core further comprises a device electrode layer
the device electrode layer is comprised of at least one of Al, Ti, In, Au, Ag, ITO, IZO, and ITZO, and
the device electrode layer corresponds to one of the first end and the second end of the light-emitting element core.

* * * * *